(12) United States Patent
Adachi et al.

(10) Patent No.: US 12,268,057 B2
(45) Date of Patent: Apr. 1, 2025

(54) METHOD FOR MANUFACTURING DISPLAY DEVICE AND DISPLAY DEVICE

(71) Applicant: SHARP KABUSHIKI KAISHA, Sakai (JP)

(72) Inventors: Takahiro Adachi, Sakai (JP); Yasushi Asaoka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 387 days.

(21) Appl. No.: 17/765,714

(22) PCT Filed: Oct. 3, 2019

(86) PCT No.: PCT/JP2019/039186
§ 371 (c)(1),
(2) Date: Mar. 31, 2022

(87) PCT Pub. No.: WO2021/064958
PCT Pub. Date: Apr. 8, 2021

(65) Prior Publication Data
US 2022/0384546 A1    Dec. 1, 2022

(51) Int. Cl.
*H10K 59/12*    (2023.01)
*H10K 59/122*    (2023.01)
*H10K 71/00*    (2023.01)

(52) U.S. Cl.
CPC .......... *H10K 59/122* (2023.02); *H10K 71/00* (2023.02); *H10K 59/1201* (2023.02)

(58) Field of Classification Search
CPC ........ H10K 71/00; H10K 71/40; H10K 59/12; H10K 59/122; H10K 59/1201; H10K 50/16; H10K 50/14; H10K 50/15; H10K 50/155; H05B 33/10; H05B 33/12; H05B 33/22
USPC ......................................................... 257/40
See application file for complete search history.

(56) References Cited

U.S. PATENT DOCUMENTS

| | | | |
|---|---|---|---|
| 2004/0137658 A1* | 7/2004 | Aratani | H10K 59/35 438/48 |
| 2005/0285509 A1* | 12/2005 | Funamoto | H10K 50/858 313/504 |
| 2006/0197086 A1* | 9/2006 | Rhee | H10K 59/122 257/E29.147 |
| 2012/0040478 A1 | 2/2012 | Takeuchi | |
| 2014/0284588 A1 | 9/2014 | Takeuchi | |

FOREIGN PATENT DOCUMENTS

| | | |
|---|---|---|
| JP | 2017037825 A | 2/2017 |
| WO | 2012/001741 A1 | 1/2012 |

\* cited by examiner

*Primary Examiner* — Chuong A Luu
(74) *Attorney, Agent, or Firm* — ScienBiziP, P.C.

(57) ABSTRACT

A method for manufacturing a display device provided with a plurality of pixels and a plurality of first electrodes in island shapes includes electrode forming of forming the plurality of first electrodes on a substrate, coating of applying a thermally decomposable resin including a charge transport material to cover the plurality of first electrodes, and decomposition processing of decomposing the thermally decomposable resin and forming a charge transport layer, and forming a partition that defines the plurality of pixels and that is provided by using the thermally decomposable resin.

6 Claims, 46 Drawing Sheets

METHOD FOR MANUFACTURING DISPLAY DEVICE AND DISPLAY DEVICE

TECHNICAL FIELD

The disclosure relates to a method for manufacturing a display device and relates to a display device.

BACKGROUND ART

A partition that defines a pixel is used in a display device including a light-emitting element such as an organic LED (hereinafter, referred to as an Organic Light Emitting Diode (OLED)). For example, Patent Literature (PTL) 1 discloses a display device including a light scattering body in a bank (partition) in order to improve light extraction efficiency. In addition, PTL 2 discloses an organic EL display panel in which a depressed portion is formed in a bank in order to improve the film thickness uniformity of a light-emitting layer and the like and to prevent clogging of the nozzle of an ink-jet head.

CITATION LIST

Patent Literature

PTL 1: JP 2017-37825 A
PTL 2: WO 2012/001741

SUMMARY

Technical Problem

However, in the related art as described above, forming a partition and forming a charge transport layer are performed in separate processes, and thus, there is a problem that a manufacturing process is complicated.

An object of one aspect of the disclosure is to improve the manufacturing efficiency of display devices.

Solution to Problem

To solve the above problem, a method for manufacturing a display device according to an aspect of the disclosure is a method for manufacturing a display device in which a plurality of pixels and a plurality of first electrodes corresponding one-to-one to the plurality of pixels are provided in island shapes, and the method for manufacturing the display device includes electrode forming of forming the plurality of first electrodes on a substrate, coating of applying a thermally decomposable resin including a charge transport material to cover the plurality of first electrodes, and decomposition processing of decomposing the thermally decomposable resin and forming a charge transport layer, and forming a partition that defines the plurality of pixels and that is provided by using the thermally decomposable resin.

In addition, a display device according to an aspect of the disclosure is a display device including a charge transport layer including a charge transport material and a partition defining the charge transport layer, and the charge transport material is included at least in an interior of the partition or on a surface of the partition at a density lower than a density in an interior of the charge transport layer.

Advantageous Effects of Disclosure

According to an aspect of the disclosure, the manufacturing efficiency of the display devices can be improved.

DESCRIPTION OF EMBODIMENTS

In this specification, an "identical layer" means being formed of an identical material in an identical process. In addition, a "lower layer" means a layer that is formed in a process prior to that of a layer to be compared, and an "upper layer" means a layer that is formed in a process after that of a layer to be compared. In this specification, a direction from a lower layer to an upper layer of a display device is defined as an upward direction. Also in this specification, "substantially free of X" means "hardly containing or not containing at all".

First Embodiment

Structure of Display Device

Figure 1:
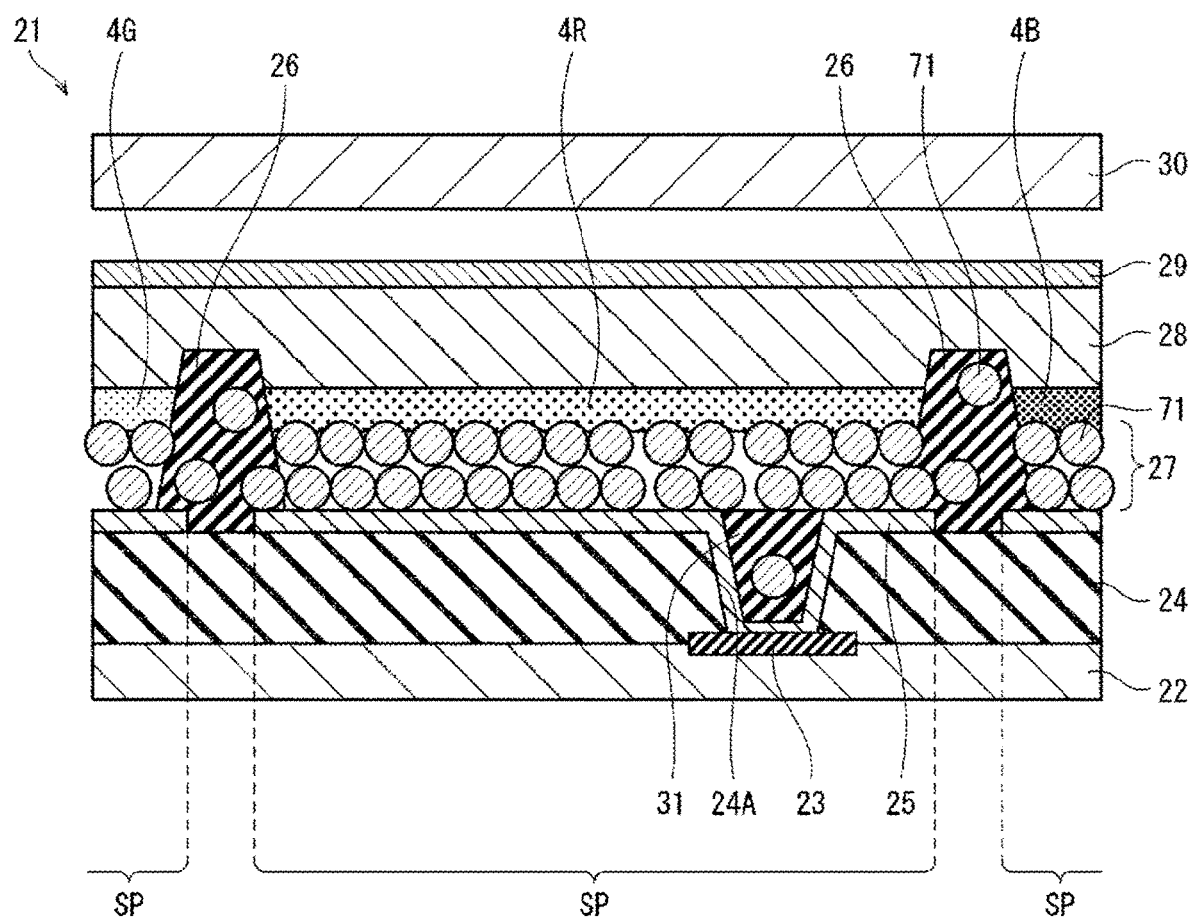
FIG. 1 is a schematic cross-sectional view of a display device according to a first embodiment of the disclosure.

With reference to FIG. 1 to FIG. 10, a first embodiment of the disclosure will be described below. FIG. 1 is a schematic cross-sectional view of a display device 21 according to the first embodiment. The display device 21 includes a support substrate 22 (substrate).

On the support substrate 22, a transistor 23, an interlayer insulating film 24 (insulating film), a cathode electrode (first electrode, Cathode Electrode, CE) 25, a partition 26, an electron transport layer (charge transport layer, Electron Transportation Layer, ETL) 27, a light-emitting layer (Emissive Layer, EML) 4R, 4G, 4B, a hole transport layer (second charge transport layer, Hole Transportation Layer, HTL) 28, an anode electrode (Anode Electrode, AE) 29, and a counter substrate 30 are formed, for example, in a manner illustrated in FIG. 1. Note that the combination of the layers, and the order of the layers illustrated in FIG. 1 are merely one example and can be changed as appropriate.

For example, the support substrate 22 may be, for example, a glass substrate obtained by singulation of a large mother glass substrate. A barrier layer (not illustrated) that prevents foreign matter such as water and oxygen from permeating into the transistor 23 and the like when the display device is used may be provided as an upper layer above the support substrate 22.

The transistor 23 may be a Thin Film Transistor (TFT), and is provided for each of a plurality of subpixels SP (pixels). The control of the transistor 23 allows the light-emitting layer 4R, 4G, 4B to be controlled in units of subpixel SP.

The interlayer insulating film 24 can be formed of, for example, an organic material being coatable such as polyimide or acrylic. A contact hole 24A that is an opening for electrically connecting the transistor 23 and the cathode electrode 25 is formed in the interlayer insulating film 24.

A plurality of the cathode electrodes 25 are provided in island shapes so as to correspond one-to-one to the plurality of subpixels SP. The cathode electrode 25 is formed by, for example, layering Indium Tin Oxide (ITO) and an alloy containing Ag and has light reflectivity. The cathode electrode 25 is electrically connected to the transistor 23 through the contact hole 24A formed in the interlayer insulating film 24, and thus, a signal in the transistor 23 is supplied to the cathode electrode 25. Note that the thickness of the cathode electrode 25 may be 100 nm, for example. On the other hand, the anode electrode 29 is formed as a common layer for the plurality of subpixels SP and can be formed of a transparent conductive material such as Indium Tin Oxide (ITO) or Indium Zinc Oxide (IZO).

The partition 26 is an insulator that defines a subpixel SP. The partition 26 is provided to cover the edge of the cathode electrode 25, and is also referred to as an edge cover or a bank. The partition 26 defines the subpixel SP, and thus, the control of the transistor 23 is transmitted to the corresponding light-emitting layer 4R, 4G, 4B.

Further, as an identical layer to that of the partition 26, a contact hole cover 31 that covers the contact hole 24A is formed as an upper layer above the cathode electrode 25 in the contact hole 24A. The contact hole cover 31 has insulating properties and contributes to the uniformity of a light-emission state of the light-emitting layers 4R, 4G, 4B by insulating the cathode electrode 25 and the electron transport layer 27 in the contact hole 24A.

The electron transport layer (charge transport layer) 27 is a layer for transporting electrons injected from the cathode electrode 25 to the corresponding light-emitting layers 4R, 4G, 4B. As a material of the electron transport layer 27, typically known materials can be used, for example, ZnO, ZnS, ZrO, MgZnO, AlZnO, or $TiO_2$, or mixtures thereof can be used. The electron transport layer 27 can be constituted by particles of an electron transport material 71, as will be described below. The thickness of the electron transport layer 27 may be, for example, 50 nm.

The hole transport layer 28 is a layer for transporting positive holes (holes) injected from the anode electrode 29 to the corresponding light-emitting layer 4R, 4G, 4B. A known material can be used as a material of the hole transport layer 28, and for example, NiO, CuI, $Cu_2O$, CoO, $Cr_2O_3$, or $CuAlS_2$, or mixtures thereof can be used.

The light-emitting layers 4R, 4G, and 4B respectively correspond to three primary colors of red, green, and blue and may be formed by using, for example, OLEDs. In a case where the light-emitting layer 4R, 4G, 4B is an OLED layer, holes and electrons are recombined inside the light-emitting layer 4R, 4G, 4B due to a drive current between the cathode electrode 25 and the anode electrode 29, and excitons generated by the recombination drop to a ground state, whereby emitting light. As a luminescent body of the light-emitting layer 4R, 4G, 4B, a known luminescent body can be used, and for example, CdSe, CdSe/ZnS, CdSe/ZnSe/ZnS, ZnSe, InP or InP/ZnS, or mixtures thereof can be used.

Although the illustration of between the anode electrode 29 and the counter substrate 30 is not performed in FIG. 1, a space between the anode electrode 29 and the counter substrate 30 is, for example, in a vacuum state, and the support substrate 22 and the counter substrate 30 may be sealed by using glass frit. Further, a sealing layer for preventing foreign matters such as water and oxygen from permeating into the anode electrode 29 or the like may be provided between the anode electrode 29 and the counter substrate 30.

The sealing layer may include an inorganic sealing film and an organic sealing film, and a plurality of inorganic sealing films and a plurality of organic sealing films may be formed. The inorganic sealing film can be configured of, for example, a silicon oxide film, a silicon nitride film, or a silicon oxynitride film, or a layered film thereof formed by using, for example, Chemical Vapor Deposition (CVD). The organic sealing film can be configured of a coatable photosensitive organic material such as polyimide or acrylic.

Note that a position, a size, and a shape of each member are not limited to those illustrated in the drawings. It should be noted, for example, that a size of particles of the electron transport material 71 is illustrated larger than its actual size for simplicity.

Method for Manufacturing Display Device

Figure 2:
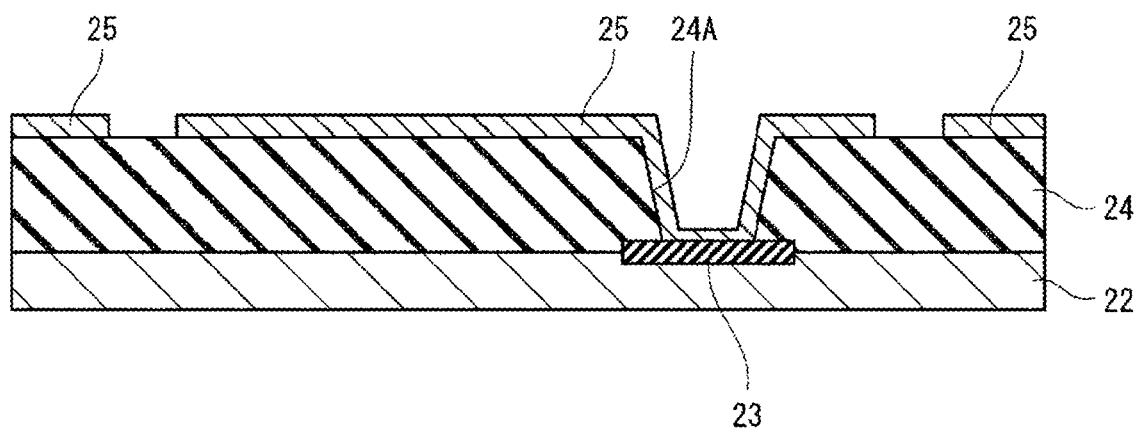
FIG. 2 is a diagram illustrating a state at a stage where a cathode electrode has been formed in a method for manufacturing the display device illustrated in FIG. 1.

Next, a method for manufacturing the display device 21 according to the present embodiment will be described in detail with reference to FIG. 2 to FIG. 10. First, as illustrated in FIG. 2, the transistor 23 and the interlayer insulating film 24 are formed in this order as an upper layer above the support substrate 22. A plurality of transistors 23 are formed corresponding one-to-one to the subpixels SP. A known method of forming the transistor 23 and the interlayer insulating film 24 can be used. For example, the interlayer insulating film 24 may be formed of a photosensitive resin by using photolithography. Then, the contact hole 24A for electrically connecting the cathode electrode 25 and the transistor 23 is formed in the interlayer insulating film 24 so as to penetrate through the interlayer insulating film 24 to reach the transistor 23.

Figure 10:
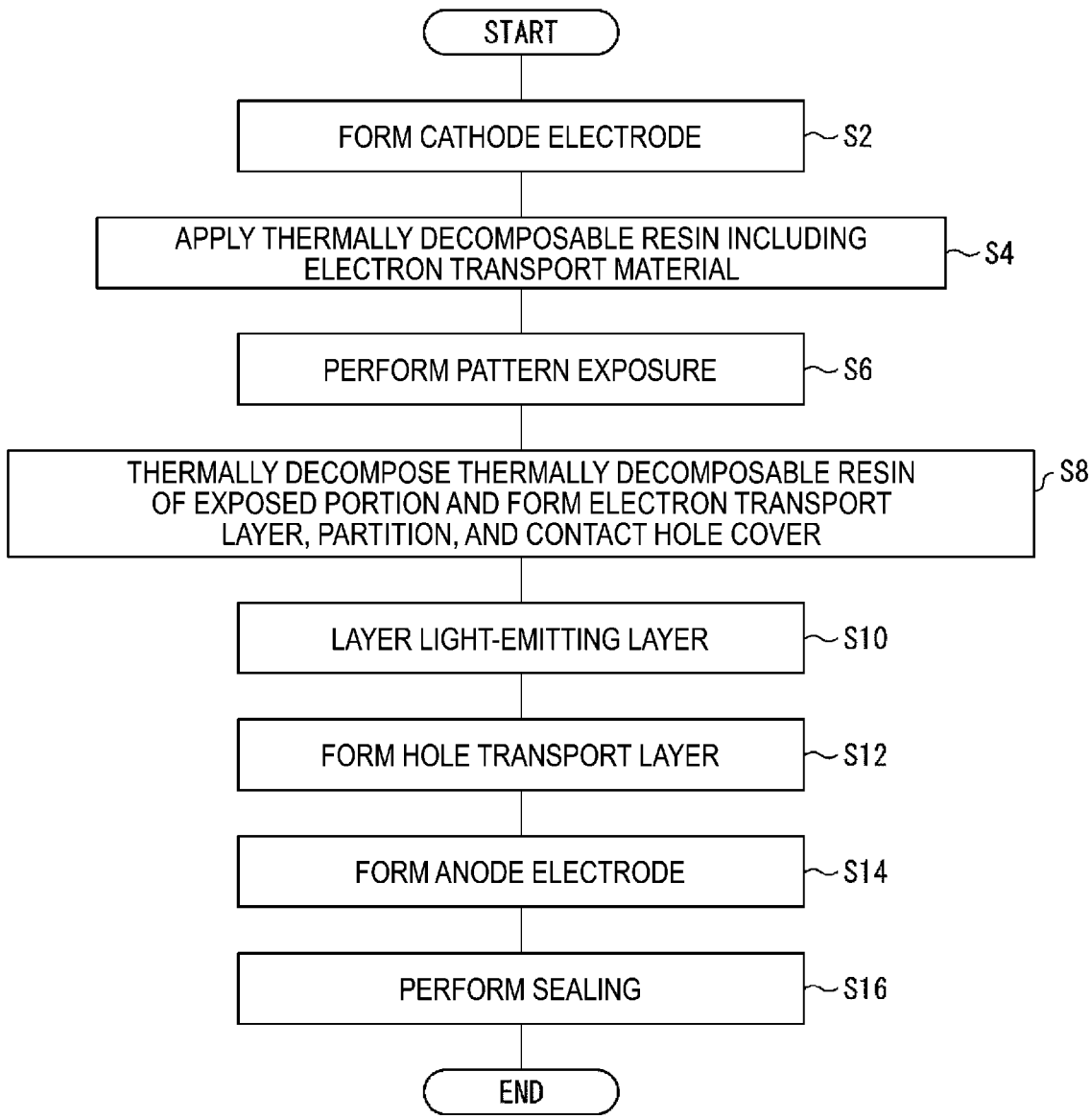
FIG. 10 is a flowchart illustrating the method for manufacturing the display device illustrated in FIG. 1.

Next, a plurality of cathode electrodes 25 are formed to cover the contact hole 24A as an upper layer above the transistor 23 and the interlayer insulating film 24 (step S2 in FIG. 10: electrode forming). A known method of forming the cathode electrode 25 can be used, and the cathode electrode 25 can be formed by, for example, sputtering (Sputter), vapor deposition, or coating by using conductive ink, or the like. The cathode electrode 25 is electrically connected to the transistor 23 in the contact hole 24A. Additionally, a plurality of cathode electrodes 25 are formed corresponding one-to-one to the plurality of subpixels SP.

Figure 3:
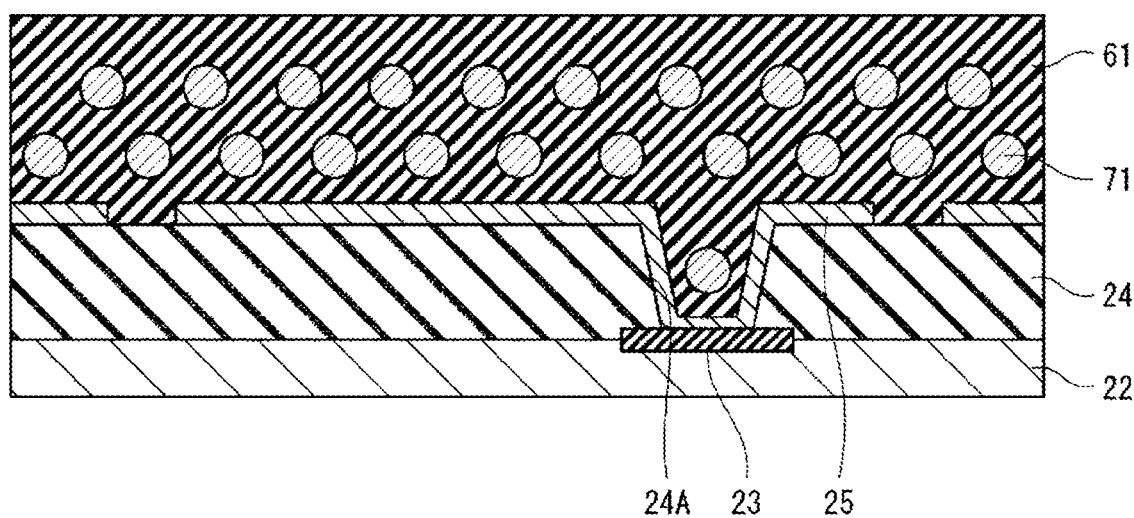
FIG. 3 is a diagram illustrating a state where thermally decomposable resin has been applied as an upper layer above the cathode electrode illustrated in FIG. 2.

Next, as illustrated in FIG. 3, as an upper layer above the interlayer insulating film 24 and the cathode electrode 25, the thermally decomposable resin 61 including the particles of the electron transport material 71 is applied so as to cover the cathode electrode 25 to fill the contact hole 24A (step S4 in FIG. 10: coating). Examples of a coating method include, but are not limited to, spin coating or a slit coating.

The thermally decomposable resin 61 may be applied in a state of being dissolved or dispersed in a solvent. A typical organic solvent can be used as the solvent. Examples of the solvent include, for example, IsoPropyl Alcohol (IPA), acetone, Propylene Glycol Monomethyl Ether Acetate (PG-MEA) and hexane.

Furthermore, after the thermally decomposable resin 61 is applied, examples of a method of drying the solvent include, for example, heating by using a hot plate, an oven, or the like, natural drying, vacuum drying, or the like. The temperature at the time of drying is preferably higher than or equal to the temperature at which the solvent used volatilizes, and is preferably higher than or equal to 25° C., for example. Furthermore, the temperature at the time of drying is preferably equal to or lower than a temperature at which the thermally decomposable resin 61 is difficult to decompose, and is preferably equal to or lower than approximately 200° C., for example.

The electron transport material 71 is preferably dispersed in the thermally decomposable resin 61 as nanoparticles having a particle diameter of about from 1 nm to 200 nm, for example. Since a distance between edges of the plurality of cathode electrodes 25 is generally approximately several μm, the particle diameter of the electron transport material 71 is preferably equal to or smaller than 200 nm, more preferably equal to or smaller than 100 nm, and even more preferably equal to or smaller than 50 nm in order to ensure the insulating properties of the partition 26, which will be described later. Furthermore, also in order to make the electron transport layer 27 thin, the particle diameter of the electron transport material 71 is preferably small. However, in a case where the particle diameter of the electron transport material 71 is excessively small, it becomes difficult to control a dispersed state when the electron transport material 71 is mixed with the thermally decomposable resin 61. Thus, the particle diameter of the electron transport material 71 is preferably equal to or larger than 1 nm, and is more preferably equal to or larger than 10 nm.

Further, in order to ensure the insulating properties of the partition 26 and the contact hole cover 31, the electron transport material 71 is preferably mixed with the thermally decomposable resin 61 at a volume ratio in a film equal to or less than 50%, is more preferably mixed at a volume ratio equal to or less than 40%, and is further preferably mixed at a volume ratio equal to or less than 30%.

As the thermally decomposable resin 61, a resin that thermally decomposes by heating can be used, and it is preferable to use a resin that does not produce active gas in decomposing. Further, in order to prevent thermal degradation of the transistor 23 or the like, the thermally decomposable resin 61 is preferably a resin that thermally decomposes at relatively low temperature, for example, a temperature equal to or lower than 250° C., and is more preferably a resin that thermally decomposes at a temperature equal to or lower than 200° C. Examples of such a thermally decomposable resin 61 include aliphatic polycarbonate having a carboxy group in the side chain, particularly, polyethylene carbonate having a carboxy group in the side chain, polypropylene carbonate or polybutylene carbonate, and the like.

In addition, a resin in which thermal decomposition temperature decreases due to light irradiation may be used as the thermally decomposable resin 61. Examples the thermally decomposable resin 61 such as this include a resin in which a part of the molecular chain is cut by light irradiation. The thermally decomposable resin 61 such as this may be monomerized as a result of the molecular chain being cut. Additionally, in order to easily form the light-emitting layer 4R, 4G, 4B in a desired shape by an ink-jet method, the thermally decomposable resin 61 may include a water-repellent component.

Figure 4:
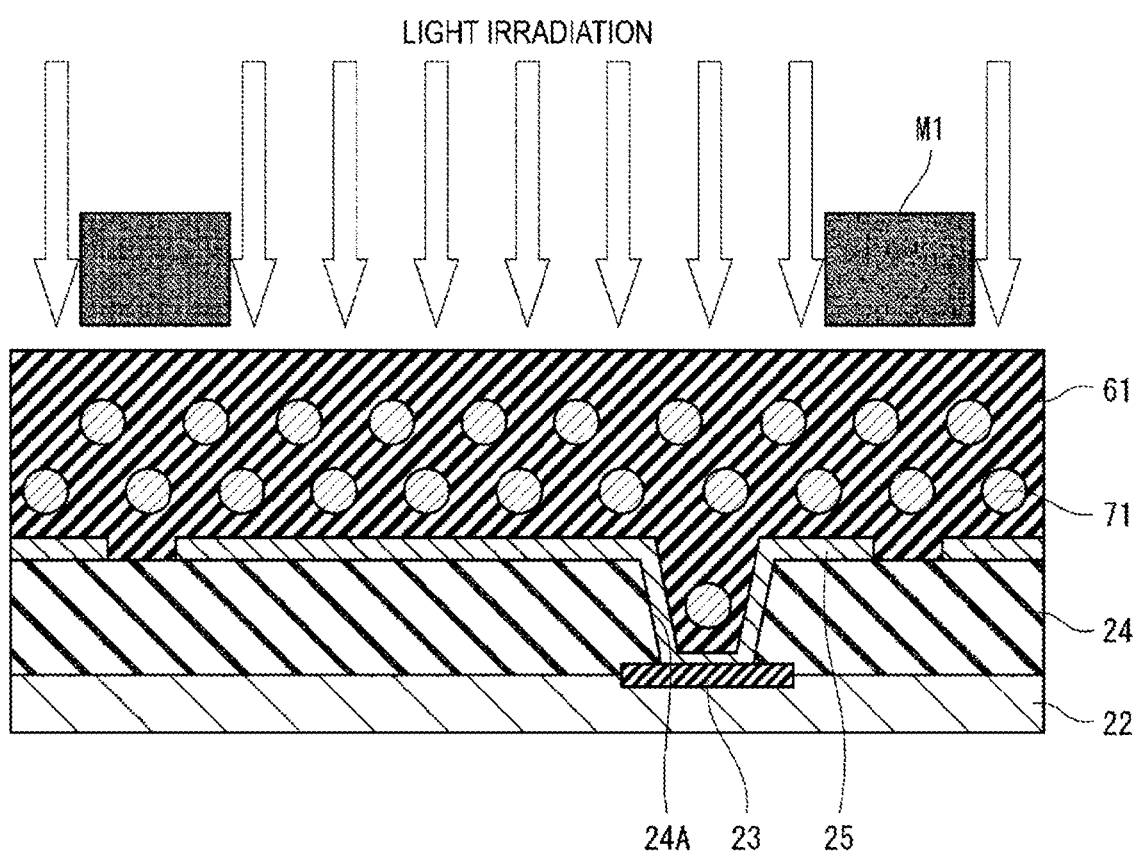
FIG. 4 is a diagram illustrating a state of irradiating the thermally decomposable resin illustrated in FIG. 3 with light.

Next, as illustrated in FIG. 4, the thermally decomposable resin 61 is irradiated with light through a photomask M1, and the thermally decomposable resin 61 is subjected to pattern exposure (step S6 in FIG. 10). The photomask M1 is disposed to cover the edge portions of the plurality of cathode electrodes 25. The partition 26, which will be described later, is formed at a position where the photomask M1 is disposed. In a portion where the photomask M1 is not disposed, the thermally decomposable resin 61 is monomerized, and the thermal decomposition temperature decreases. In other words, only the portion to be decomposed in the thermally decomposable resin 61 is monomerized. Thus, it is easy to clearly divide the thermally decomposable resin 61 into the portion where the thermally decomposable resin 61 is to be decomposed and the portion where the thermally decomposable resin 61 is not to be decomposed.

The irradiation light used in step S6 is not particularly limited as long as a part of the molecular chain of the thermally decomposable resin 61 can be cut. For example, as a light source, by using a xenon excimer lamp, a mercury lamp, a KrF excimer laser, an ArF excimer laser, or an $F_2$ excimer laser, Ultra Violet (UV) light with a wavelength of from 10 nm to 400 nm may be irradiated at an exposure amount equal to or larger than 10 mJ/cm$^2$, for example, 100 mJ/cm$^2$.

Figure 5:
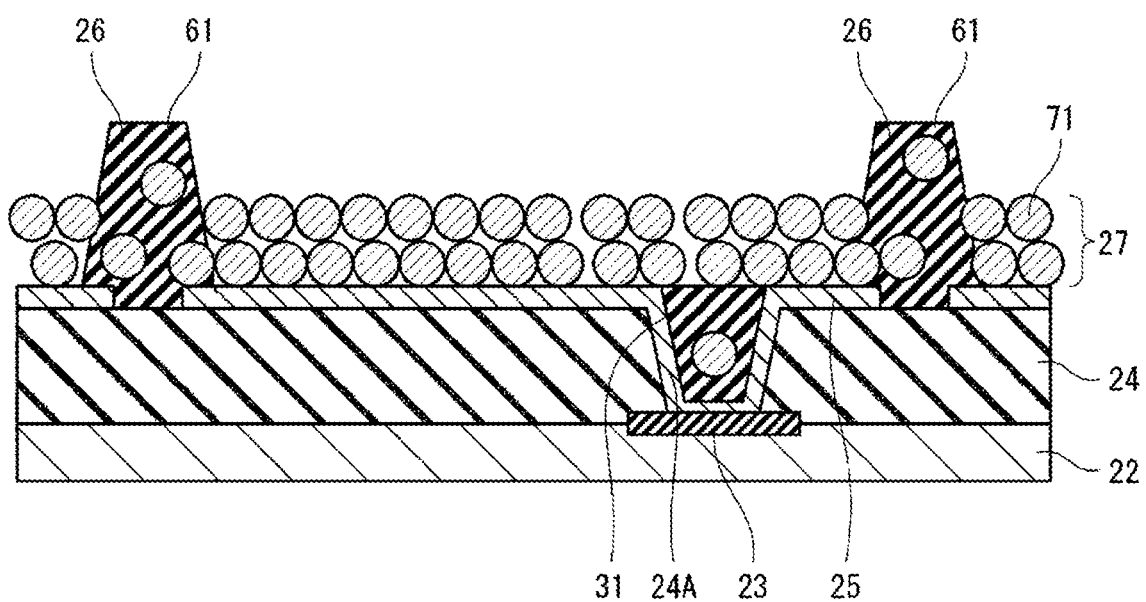
FIG. 5 is a diagram illustrating a state where a part of the thermally decomposable resin illustrated in FIG. 4 has been thermally decomposed and an electron transport layer has been formed.

Next, as illustrated in FIG. 5, the thermally decomposable resin 61 is heated and the thermally decomposable resin 61 of the exposed portion is thermally decomposed to form the electron transport layer 27, the partition 26, and the contact hole cover 31 (step S8 in FIG. 10: decomposition processing). The partition 26 and the contact hole cover 31 are provided by using the thermally decomposable resin 61. A heating method is, but is not limited to, for example, heating by using an oven or a hot plate. Note that, in order to suppress the oxidation degradation of each member during heating, it is preferable to perform heating under a deoxygenation atmosphere such as a nitrogen atmosphere.

The heating temperature is not particularly limited as long as the heating temperature is a temperature at which the exposed portion of the thermally decomposable resin 61 can be thermally decomposed, is preferably equal to or higher than 50° C., is more preferably equal to or higher than 100° C., and is even more preferably equal to or higher than 150° C. Further, in order to prevent ITO, IZO, or the like used as the material of the cathode electrode 25 from deteriorating, the heating temperature is preferably equal to or lower than 300° C., is more preferably equal to or lower than 250° C., is even more preferably equal to or lower than 200° C., and is even more preferably equal to or lower than 150° C.

The heating time is not particularly limited as long as the thermally decomposable resin 61 can be sufficiently thermally decomposed at the temperature, is preferably equal to or longer than 60 seconds, is more preferably equal to or longer than 10 minutes, and is even more preferably equal to or longer than 30 minutes. Further, in order to avoid an increase in manufacturing costs due to the extension of heating time, the heating time is preferably equal to or shorter than two hours, is more preferably equal to or shorter than one hour, and is even more preferably equal to or shorter than 30 minutes.

Note that as illustrated in FIG. 5, the contact hole cover 31 to be provided by the thermally decomposable resin 61 of the exposed portion is formed by controlling the heating temperature and the heating time. Specifically, as illustrated in FIG. 4, the thickness of the thermally decomposable resin 61 applied to a portion where the contact hole 24A is formed is larger than the thickness of the thermally decomposable resin 61 applied to a portion where the contact hole 24A is not formed. Thus, when the thermally decomposable resin 61 applied to the cathode electrode 25 is collectively thermally decomposed, it is possible to form the electron transport layer 27 while the contact hole cover 31 is formed by leaving a part of the thermally decomposable resin 61 applied to the portion where the contact hole 24A is formed.

As described above for step S4, the electron transport material 71 is mixed with the thermally decomposable resin 61 at a volume ratio in a film equal to or less than 50%, for example. Thus, since a density of the electron transport material 71 in the partition 26 and the contact hole cover 31 is low, the insulating properties of the partition 26 and the contact hole cover 31 are ensured. Note that after the end of step S8, the thermally decomposable resin 61 may remain in the electron transport layer 27 in a range where the electrical conductivity of the electron transport layer 27 can be ensured.

A density of the electron transport material 71 included in an interior of the electron transport layer 27 may be higher than a density of the electron transport material 71 included at least in an interior of the partition 26 or on a surface of the partition 26. In other words, the partition 26 may include the electron transport material 71 at a density lower than that of the interior of the electron transport layer 27 at least in the interior of the partition 26 or on the surface of the partition 26.

By changing the volume ratio and a coating thickness of the electron transport material 71 and the thermally decomposable resin 61 that are applied in step S4, the height of the partition 26 can be changed. Note that in this specification, the "coating thickness" refers to the thickness of the thermally decomposable resin 61 after drying and removing the solvent that dissolves or disperses the thermally decomposable resin 61. For example, it is assumed and considered that nanoparticies of the electron transport material 71 are spherical, have particle diameters equal to each other, and are randomly filled at a space filling rate of 64%. When the thickness of the electron transport layer 27 is 50 nm, a volume ratio between the electron transport material 71 and the thermally decomposable resin 61 is set to approximately 1:31, and by setting the coating thickness to approximately 1 µm, the height of the partition 26 formed in step S8 can be set to approximately 1 µm. In a case where the height of the partition 26 is approximately 1 µm, in the step S10, which will be described below, the light-emitting layer 4R, 4G, 4B can be layered by an inkjet method.

Figure 6:
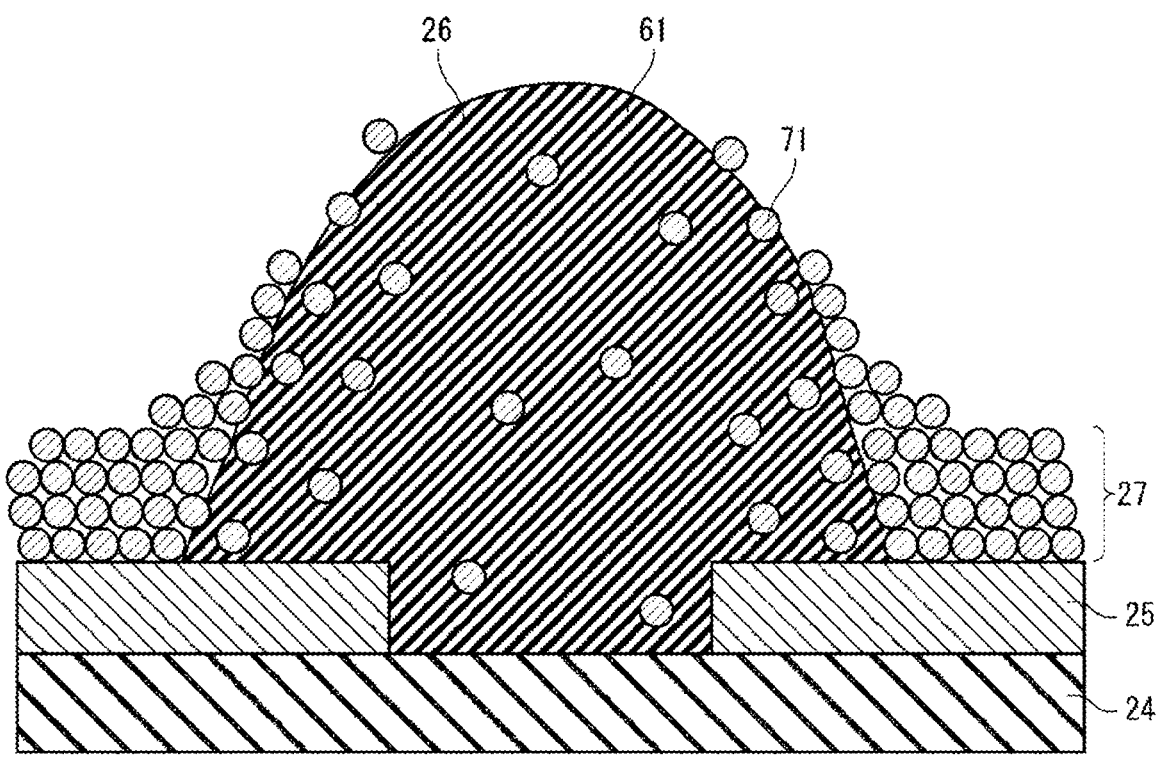
FIG. 6 is a schematic enlarged view of the partition illustrated in FIG. 5.

As enlarged and schematically illustrated in FIG. 6, an upper end of the partition 26 formed in step S8 is rounded. This is because diffraction of light at a peripheral portion of the photomask M1 during the exposure of step S6 results in a decrease in residual amount of the thermally decomposable resin 61 at the peripheral portion of the partition 26 in step S8. Thus, when the upper layer above the partition 26 is formed, connection failure at a step is not likely to occur. As a result, since a yield is improved, further cost reduction can be achieved.

Additionally, in the decomposition processing step S8, the electron transport material 71 is left at least in the interior of the partition 26 or on the surface of the partition 26. Thus, since the electron transport material 71 remaining in the interior and/or on the surface of the partition 26 refracts light, it is possible to control light emission by the display device in response to how much the charge transport material 71 is left in the interior and/or on the surface of the partition 26.

In addition, due to the diffraction of light during the exposure of step S6, the density of the electron transport material 71 increases closer to the surface of the partition 26. Thus, when light from the light-emitting layer 4R, 4G, 4B, which will be described later, reaches the surface of the partition 26, reflected light increases, thereby improving light extraction efficiency.

Figure 7:
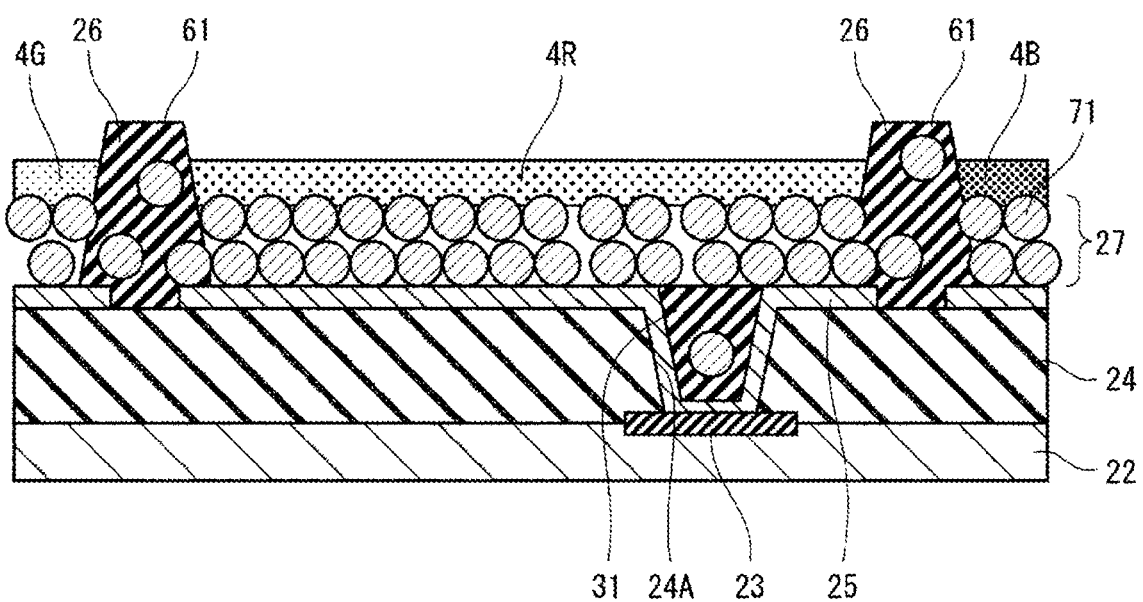
FIG. 7 is a diagram illustrating a state where a light-emitting layer has been layered as an upper layer above the electron transport layer illustrated in FIG. 5.

Subsequently, as illustrated in FIG. 7, the light-emitting layer 4R, 4G, 4B is layered on the electron transport layer 27 (step S10 in FIG. 10). As a method of forming the light-emitting layer 4R, 4G, 4B, a known method can be used, and for example, an ink-jet method or a QD (quantum dot, Quantum Dot) photoresist method can be used. In the example in FIG. 7, the light-emitting layer 4R, 4G, 4B is formed by the ink-jet method.

Figure 8:
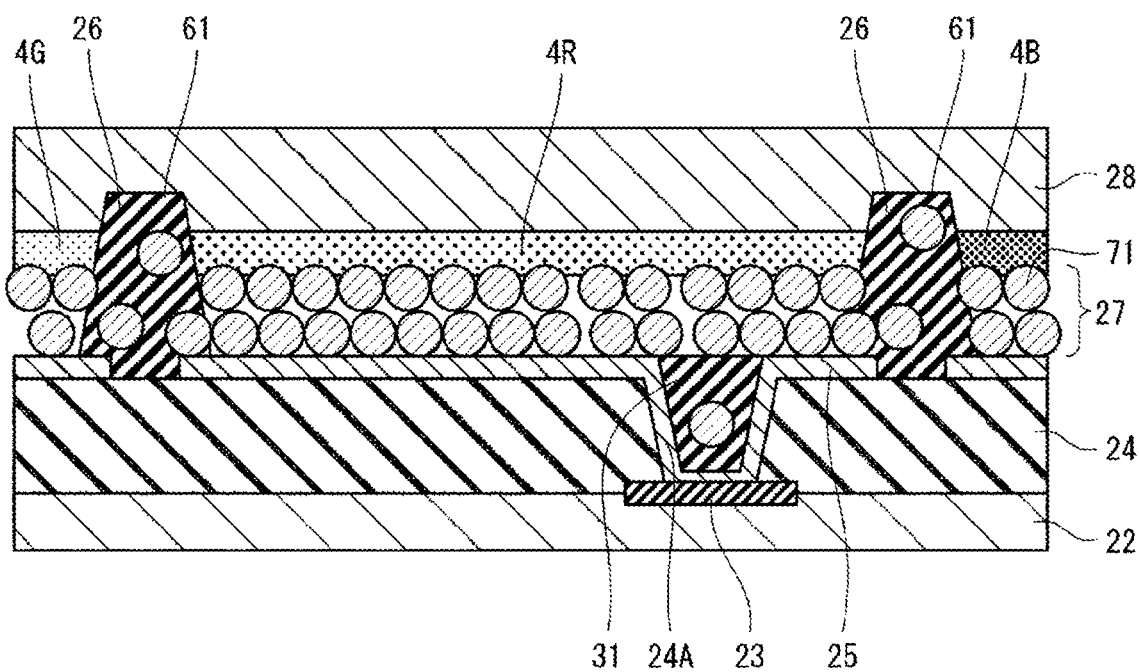
FIG. 8 is a diagram illustrating a state where a hole transport layer has been layered as an upper layer above the light-emitting layer and the partition illustrated in FIG. 7.

Subsequently, as illustrated in FIG. 8, the hole transport layer 28 is layered on the light-emitting layer 4R, 4G. 4B and the partition 26 (step S12 in FIG. 10). A known method can be used as a method of forming the hole transport layer 28, and for example, an ink-jet method or a QD photoresist method can be used.

Figure 9:
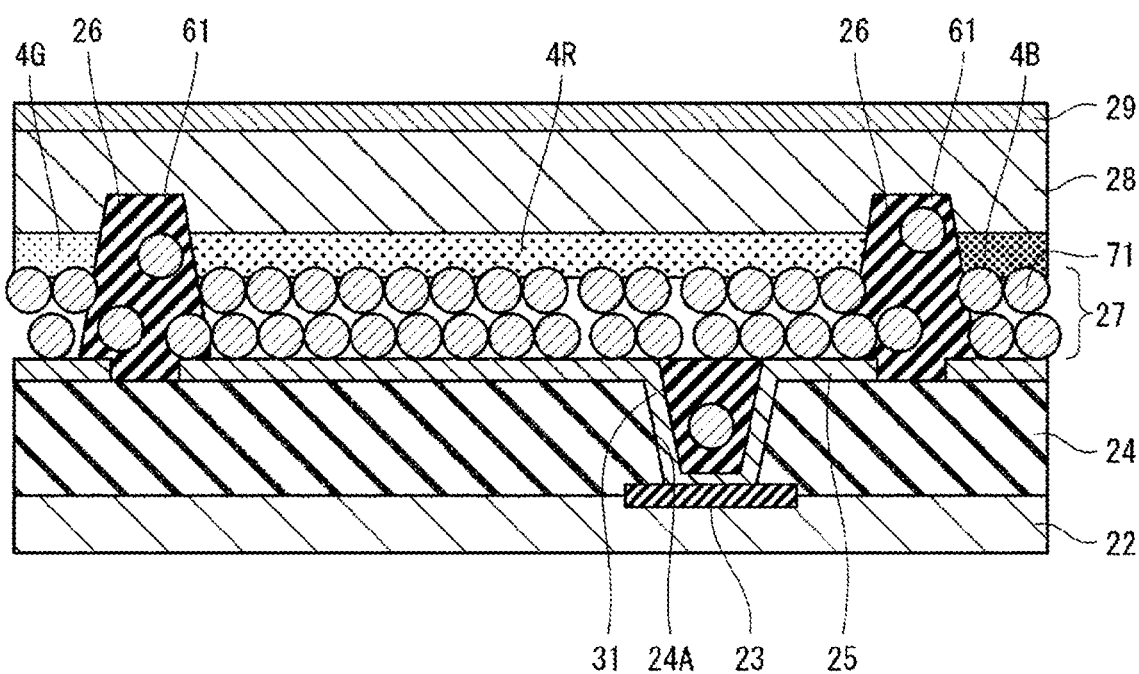
FIG. 9 is a diagram illustrating a state where an anode electrode has been layered as an upper layer above the hole transport layer illustrated in FIG. 8.

Next, as illustrated in FIG. 9, the anode electrode 29 is layered on the hole transport layer 28 (step S14 in FIG. 10). As a method of forming the anode electrode 29, a known method can be used, and for example, vapor deposition or sputtering can be used. Then, as illustrated in FIG. 1, the counter substrate 30 is formed (step S16 in FIG. 10). The display device 21 can be manufactured by the method described above.

According to the configuration described above, the electron transport layer 27 and the partition 26 can be collectively formed, and thus, the manufacturing man-hours can be reduced. Further, since the contact hole cover 31 can also be formed collectively with the electron transport layer 27 and the partition 26, further reduction in manufacturing man-hours can be achieved.

Second Embodiment

Another embodiment of the disclosure will be described below. Note that, for convenience of description, members having the same functions as those of the members described in the above-described embodiment will be denoted by the same reference numerals and signs, and the description thereof will not be repeated.

Figure 18:
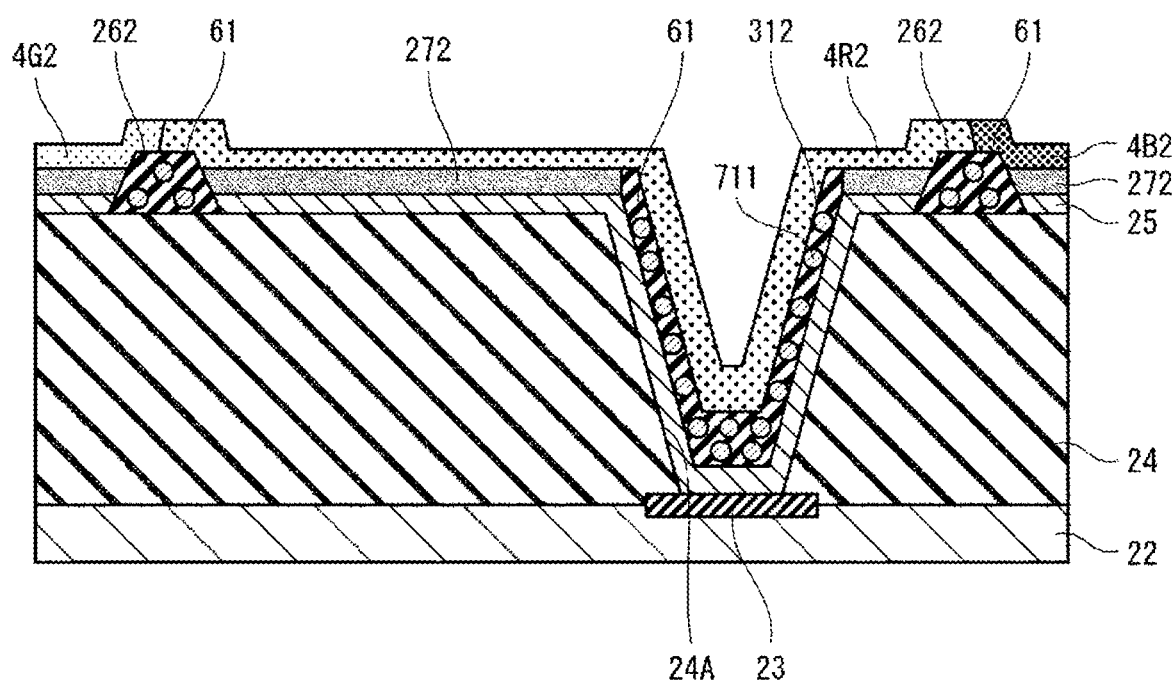
FIG. 18 is a diagram illustrating a state at a stage where blue and green light-emitting layers have been formed as an upper layer above the electron transport layer illustrated in FIG. 16.

In a second embodiment, in step S10 in FIG. 10, a main difference from the first embodiment is the fact that a light-emitting layer 4R2, 4G2, 4B2 is formed by a QD photoresist method, instead of forming the light-emitting layer 4R, 4G, 4B by the ink-jet method. As illustrated in FIG. 18, when the light-emitting layer 4R2, 4G2, 4B2 is formed by the QD photoresist method, the height of a partition 262 may be lower than the height of the partition 26 of the first embodiment, and may be, for example, 100 nm.

Figure 11:
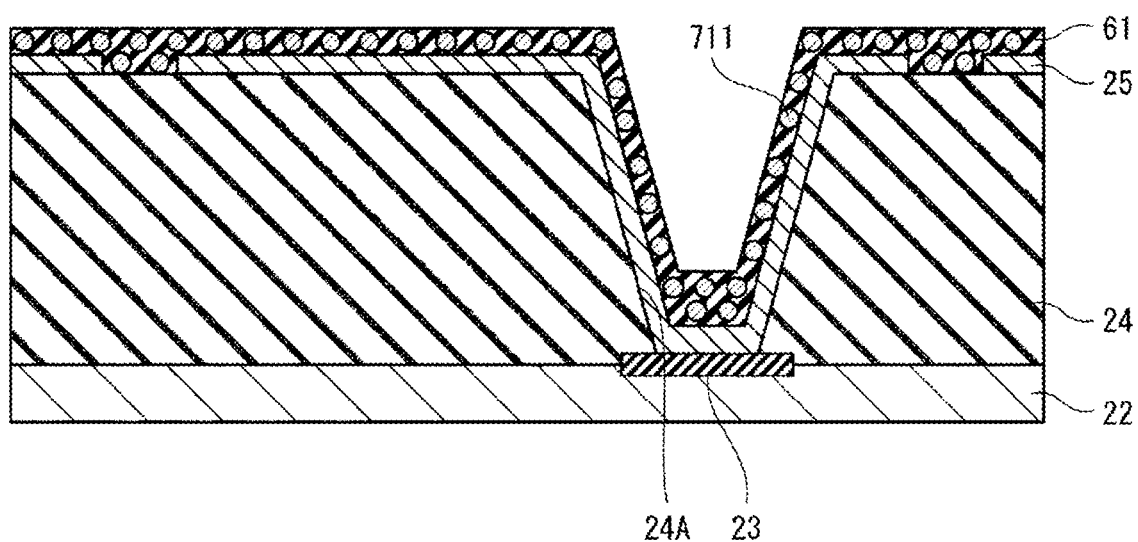
FIG. 11 is a diagram illustrating a state where thermally decomposable resin has been applied as an upper layer above a cathode electrode in a method for manufacturing a display device according to a second embodiment of the disclosure.

The second embodiment will be described below in detail with reference to FIG. 10 to FIG. 20. First, as illustrated in FIG. 11, the thermally decomposable resin 61 including particles of an electron transport material 711 is applied as an upper layer above the interlayer insulating film 24 and the cathode electrode 25 that are formed similarly to the first embodiment (step S4 in FIG. 10). In order to set the height of the partition 262 of the second embodiment to be lower than the height of the partition 26 of the first embodiment, the volume ratio of the electron transport material 711 with respect to the thermally decomposable resin 61 may be higher than that of the first embodiment.

For example, it is assumed and considered that the nanoparticles of the electron transport material 711 are spherical, have particle diameters equal to each other, and are randomly filled at a space filling rate of 64%. When a thickness of the electron transport layer 272 is set to 50 nm, a volume ratio between the electron transport material 711 and the thermally decomposable resin 61 is set to approximately 1:1.6, and the height of the partition 26 to be formed in step S8 can be set to approximately 100 nm by setting a coating thickness to approximately 100 nm. Note that, in this case, the coating thickness of the thermally decomposable resin 61 is thin, and thus, the surface of the thermally decomposable resin 61 applied to the portion where the contact hole 24A is formed has a recessed shape.

Figure 12:
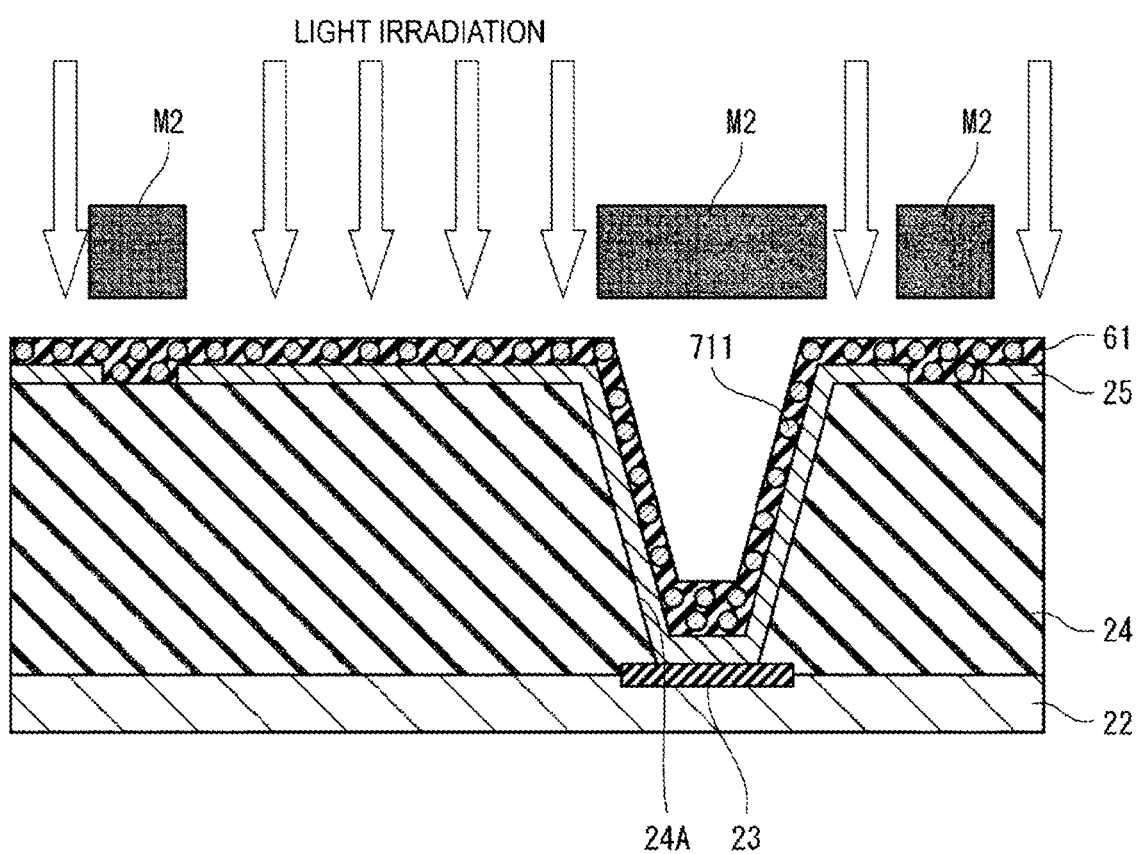
FIG. 12 is a diagram illustrating a state of irradiating the thermally decomposable resin illustrated in FIG. 11 with light.

Next, as illustrated in FIG. 12, the thermally decomposable resin 61 is irradiated with light through a photomask M2, and the thermally decomposable resin 61 is subjected to pattern exposure (step S6 in FIG. 10). Unlike the first embodiment, in the second embodiment, the photomask M2 is disposed to cover the contact hole 24A as well as the edge portions of the plurality of cathode electrodes 25. This is because, since the thickness of the thermally decomposable resin 61 in the second embodiment is thin, when the thermally decomposable resin 61 applied to the portion where the contact hole 24A is formed is exposed to light, there is a concern that the cathode electrode 25 and the electron transport layer 272 may electrically conduct in the contact hole 24A. In other words, a contact hole cover 312, which will be described later, is formed by preventing the thermally decomposable resin 61 applied to the portion where the contact hole 24A is formed from decomposing.

Figure 13:
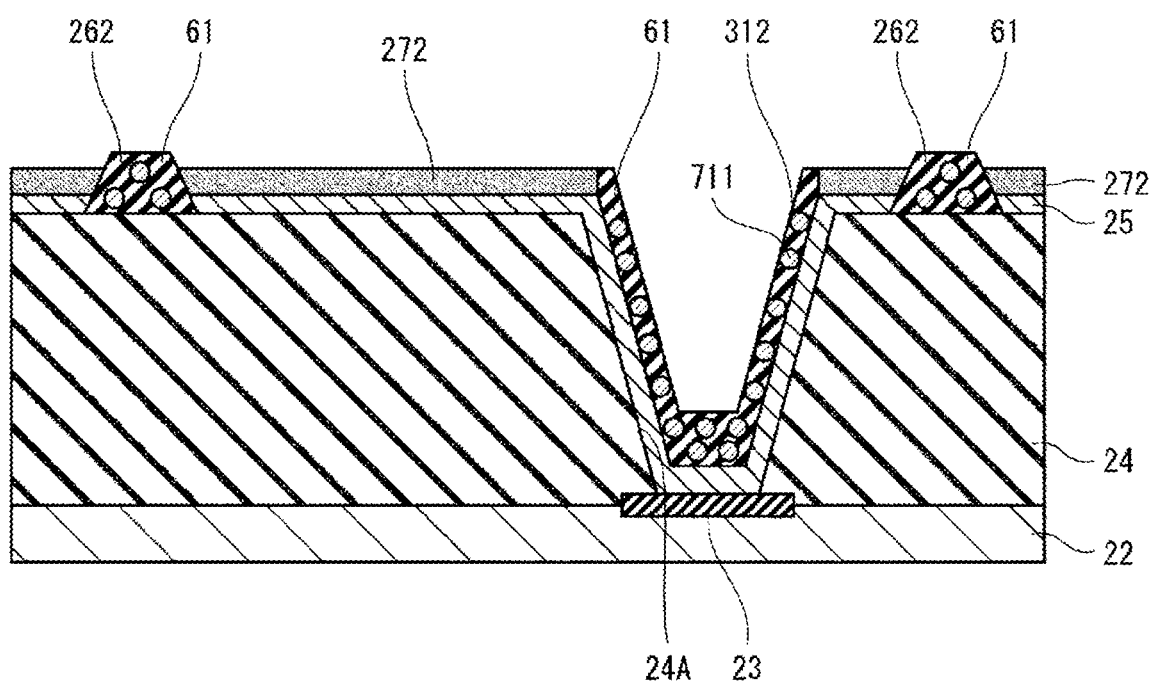
FIG. 13 is a diagram illustrating a state where a part of the thermally decomposable resin illustrated in FIG. 12 has been thermally decomposed and an electron transport layer has been formed.

Next, as illustrated in FIG. 13, the thermally decomposable resin 61 is heated and the thermally decomposable resin 61 of the exposed portion is thermally decomposed to form the electron transport layer 272, the partition 262, and the contact hole cover 312 (step S8 in FIG. 10). As described above, the thickness of the electron transport layer 272 is approximately 50 nm, and the height of the partition 262 is approximately 100 nm. Note that the nanoparticles densely exist in the electron transport layer 272, but the individual nanoparticles are not illustrated in FIG. 13 to FIG. 18.

The heating time is not particularly limited as long as the thermally decomposable resin 61 can be sufficiently thermally decomposed at the temperature, and is preferably equal to or longer than 60 seconds, is more preferably equal to or longer than 10 minutes, and is even more preferably equal to or longer than 20 minutes. Note that, since the thickness of the thermally decomposable resin 61 of the second embodiment is thinner than that of the first embodiment, the heating time of the second embodiment may be shorter than that of the first embodiment.

Figure 14:
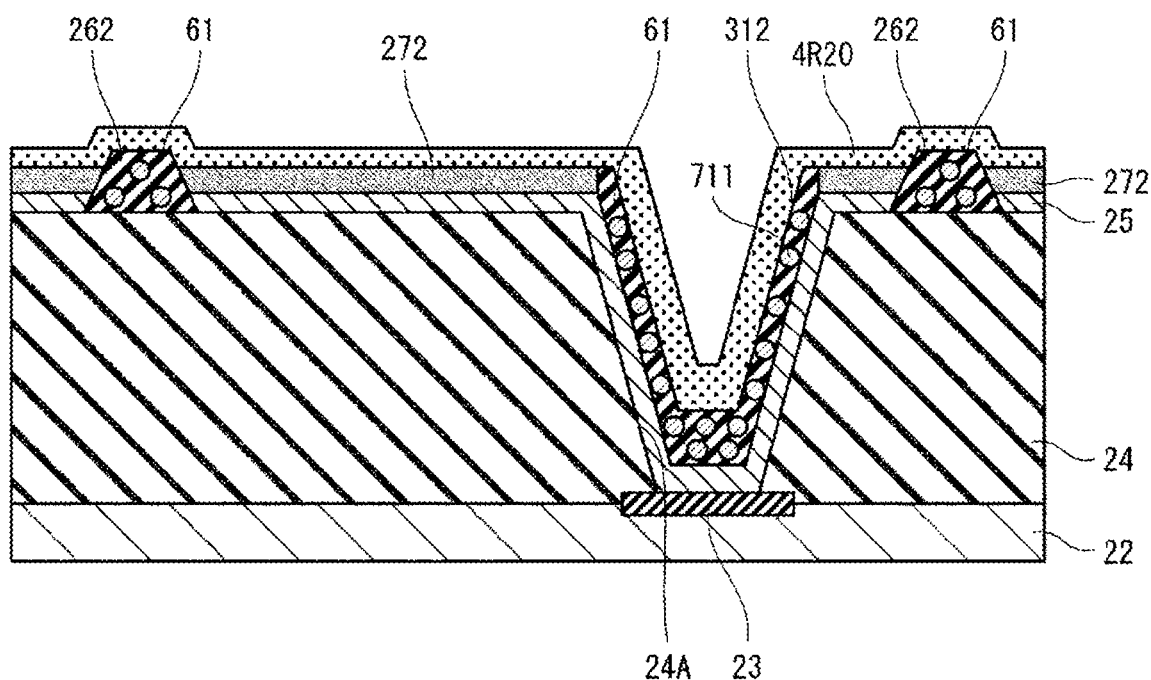
FIG. 14 is a diagram illustrating a state where a red luminescent material has been applied as an upper layer above the electron transport layer illustrated in FIG. 13.

Next, as illustrated in FIG. 14 to FIG. 18, the light-emitting layer 4R2, 4G2, 4B2 is layered over the electron transport layer 272 and the partition 262 (step S10 in FIG. 10). In the second embodiment, the light-emitting layer 4R2, 4G2, 4B2 is formed by a QD photoresist method. First, as illustrated in FIG. 14, a red luminescent material 4R20 including a red luminescent body and a resist material is applied to the partition 262, the electron transport layer 272, and the contact hole cover 312. As the coating method, a known coating method may be used, and for example, spin coating or slit coating may be used. The coating thickness may be, for example, about 30 nm.

As the resist material, a known resist material can be used, and for example, acrylic resin or epoxy resin may be used. Note that, in the present embodiment, a negative photoresist where a portion irradiated with light is cured and remains is used, but a positive photoresist may be used to form the light-emitting layer 4R2, 4G2, 4B2.

Figure 15:
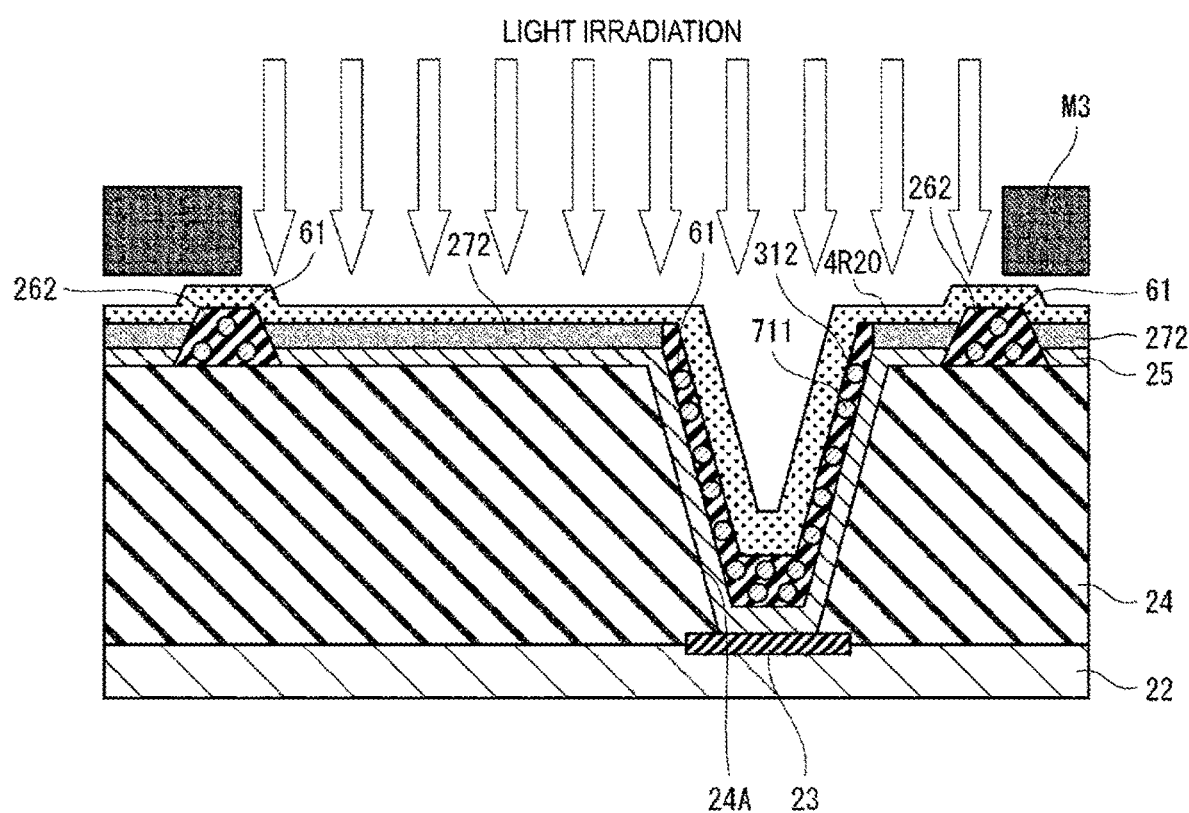
FIG. 15 is a diagram illustrating a state of irradiating the red luminescent material illustrated in FIG. 14 with light.

Next, as illustrated in FIG. 15, the red luminescent material 4R20 is irradiated with light through a photomask M3, and the red luminescent material 4R20 is subjected to pattern exposure. The photomask M3 opens at a position where the red light-emitting layer 4R2 is formed. The irradiation light is not particularly limited as long as the resist material can be cured. For example, by using a mercury lamp, a KrF excimer laser, an ArF excimer laser, or an F2 excimer laser as a light source, light may be irradiated at an exposure amount of from 10 mJ/cm$^2$ to 1000 mJ/cm$^2$, for example, 100 mJ/cm$^2$. A wavelength of the irradiation light is not particularly limited as long as the wavelength of the irradiation light is a photosensitive wavelength of the resist material, but the wavelengths of 436 nm, 405 nm, and 365 nm respectively corresponding to a g-line, an h-line, and an i-line of the mercury lamp may be used, for example.

Figure 16:
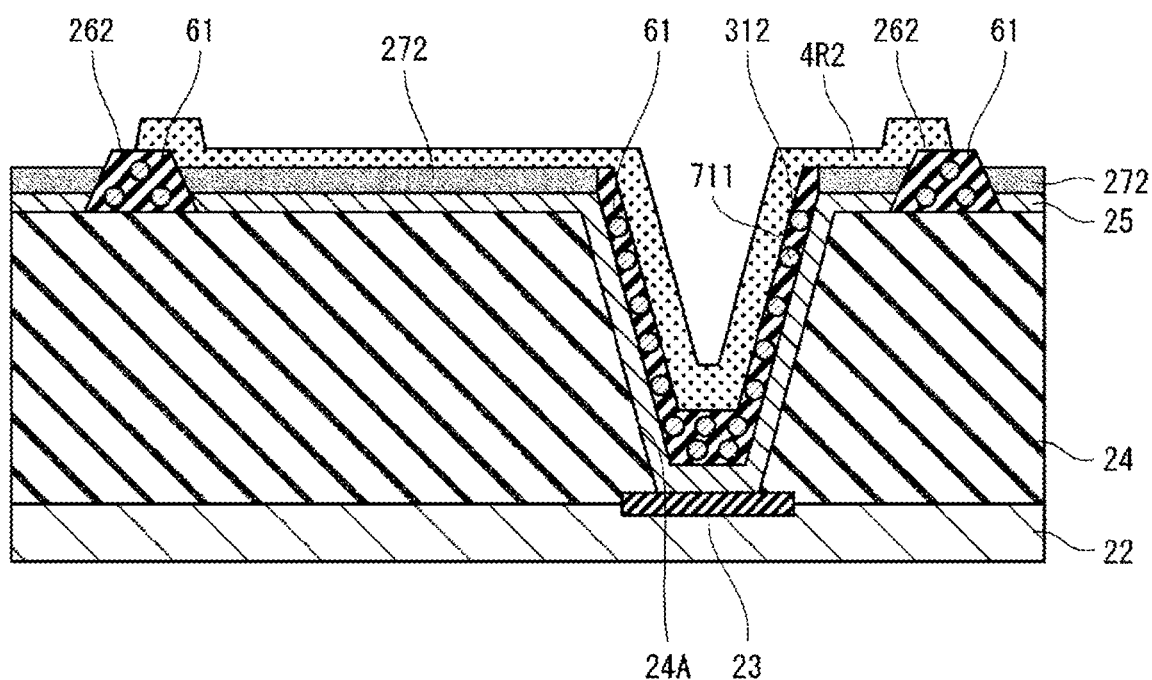
FIG. 16 is a diagram illustrating a state at a stage where the red luminescent material illustrated in FIG. 15 has been developed and a red light-emitting layer has been formed.

Next, as illustrated in FIG. 16, the red luminescent material 4R20 irradiated with light is developed, and the red light-emitting layer 4R2 is formed. Although there are no limitations with respect to the developing solution, an inorganic developer or an organic developer can be used, for example. Examples of the inorganic developer include aqueous potassium hydroxide solution, and examples of the organic developer include Propylene Glycol Monomethyl Ether Acetate (PGMEA), aqueous TetraMethylAmmonium Hydroxide (TMAH) solution, toluene, and chloroform.

The developing time is not particularly limited as long as the resist material of unnecessary portions can be removed in the developing time, and may be developed, for example, for approximately from 10 seconds to 60 minutes. A developing temperature is not particularly limited as long as the developing temperature is a temperature at which development is efficiently advanced and the other layers are not damaged, and the development may be performed, for example, from 0° C. to 50° C.

Figure 17:
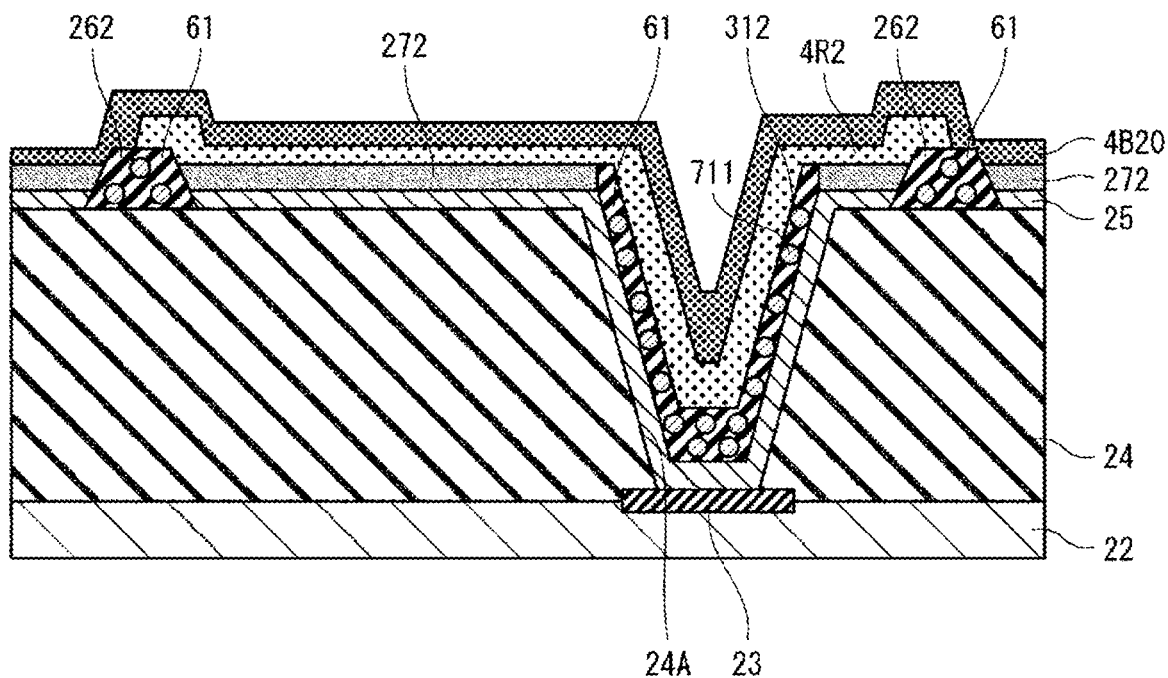
FIG. 17 is a diagram illustrating a state where a blue luminescent material has been applied as an upper layer above the red light-emitting layer and the electron transport layer illustrated in FIG. 16.

Then, similarly to the case of the red light-emitting layer 4R2, the blue light-emitting layer 4B2 and the green light-emitting layer 4G2 are formed. Specifically, first, as illustrated in FIG. 17, a blue luminescent material 4B20 including a blue luminescent body and a resist material is applied to the partition 262, the electron transport layer 272, and the red light-emitting layer 4R2. Next, the blue luminescent material 4B20 is subjected to pattern exposure through a photomask (not illustrated) which is open at a position at which the blue light-emitting layer 4B2 is formed. Then, the blue luminescent material 4B20 irradiated with light is developed, and the blue light-emitting layer 4B2 illustrated in FIG. 18 is formed.

Furthermore, a green luminescent material (not illustrated) including a green luminescent body and a resist material is applied to the partition 262, the electron transport layer 272, the red light-emitting layer 4R2, and the blue light-emitting layer 4B2. Next, the green luminescent material is subjected to pattern exposure through a photomask (not illustrated) which is open at a position at which the green light-emitting layer 4G2 is formed. Then, the green luminescent material irradiated with light is developed, and the green light-emitting layer 4G2 illustrated in FIG. 18 is formed.

A shape and a size of the photomask are set such that a boundary between the red light-emitting layer 4R2 and the blue light-emitting layer 4B2 and a boundary between the red light-emitting layer 4R2 and the green light-emitting layer 4G2 are located on an upper surface of the partition 262. At an upper portion of the partition 262, the insulating properties of the partition 262 prevent electrical conduction between the light-emitting layer 4R2, 4G2, 4B2 and the cathode electrode 25, and thus, color mixing can be prevented when the light-emitting layer 4R2, 4G2, 4B2 is caused to emit light.

Steps from S12 to S16 (in FIG. 10) after the light-emitting layer 4R2, 4G2, 4B2 is formed are similar to those of the first embodiment. According to the configuration described above, since the contact hole cover 312 can also be formed collectively with the electron transport layer 272 and the partition 262, further reduction in manufacturing man-hours can be achieved. Further, also in a case where the light-emitting layer 4R2, 4G2, 4B2 is formed over the electron transport layer 272 and the partition 262, a reduction in manufacturing man-hours can be achieved.

Modified Example of Second Embodiment

Figure 19:
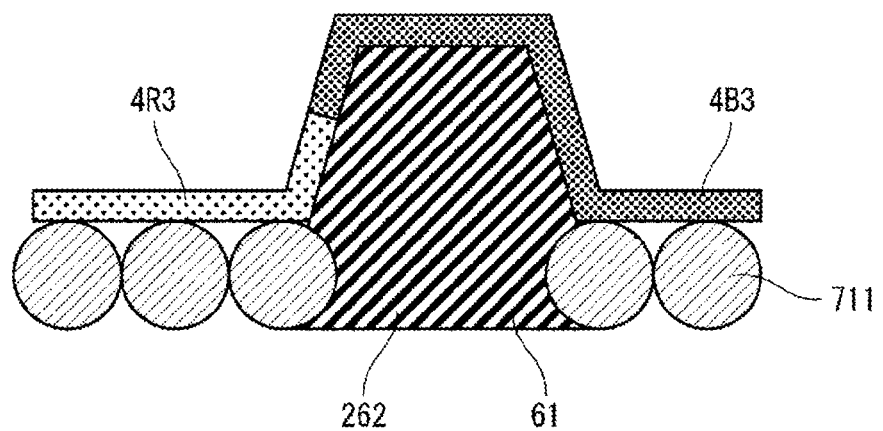
FIG. 19 is an enlarged view illustrating a boundary between a red light-emitting layer and a blue light-emitting layer in a display device according to a modified example of the second embodiment of the disclosure.

In the above-described embodiment illustrated in FIG. 18, the boundary between the red light-emitting layer 4R2 and the blue light-emitting layer 4B2 and the boundary between the red light-emitting layer 4R2 and the green light-emitting layer 4G2 are located on the upper surface of the partition 262. However, the boundary is only required to be located at the upper portion of the partition 262, and for example, as illustrated in FIG. 19, a boundary between a red light-emitting layer 4R3 and a blue light-emitting layer 4B3 may be located on a side surface of the partition 262.

Figure 20:
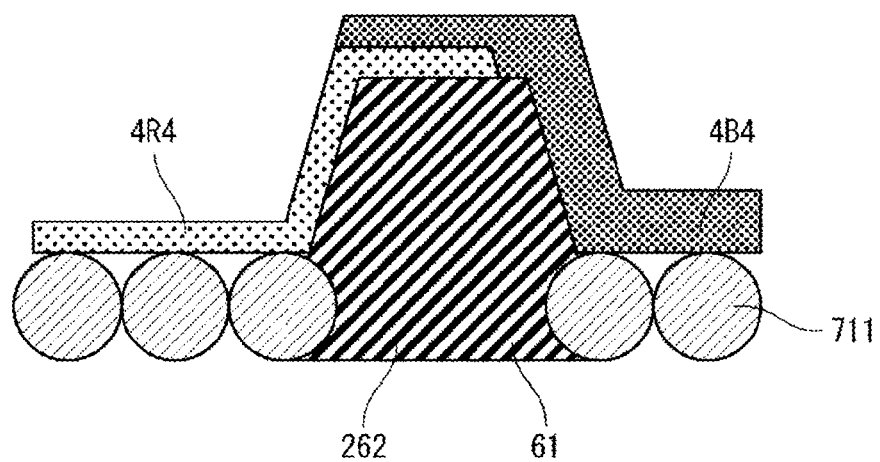
FIG. 20 is an enlarged view illustrating a boundary between a red light-emitting layer and a blue light-emitting layer in a display device according to another modified example of the second embodiment of the disclosure.

Alternatively, as illustrated in FIG. 20, for example, a red light-emitting layer 4R4 and a blue light-emitting layer 4B4 may be overlapped on the upper surface of the partition 262. Additionally, the respective thicknesses of the light-emitting layers may be different from each other, and for example, in the example in FIG. 20, the thickness of the blue light-emitting layer 4B4 is set to be larger than the thickness of the red light-emitting layer 4R4.

Third Embodiment

Figure 21:
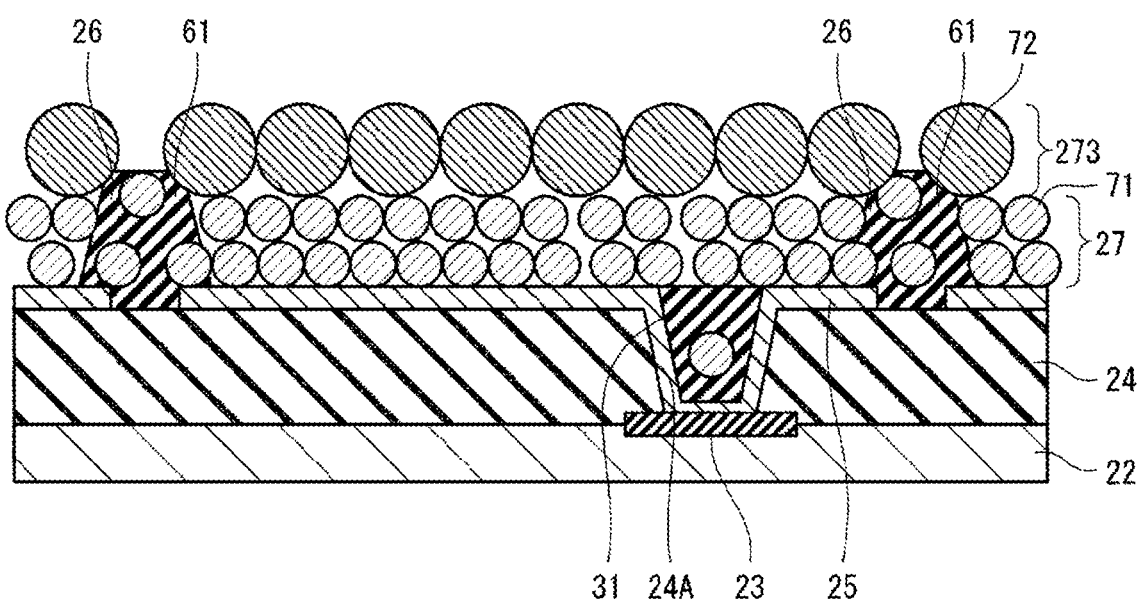
FIG. 21 is a diagram illustrating a state where a highly efficient electron transport layer has been formed as an upper layer above an electron transport layer in a method for manufacturing a display device according to a third embodiment of the disclosure.

A third embodiment differs from the first embodiment in that, as illustrated in FIG. 21, a highly efficient electron transport layer 273 (highly efficient charge transport layer) is formed on the electron transport layer 27. The highly efficient electron transport layer 273 is configured of a highly efficient electron transport material 72 (highly efficient charge transport material) having a particle diameter or a material being different from that of the electron transport material 71.

Figure 22:
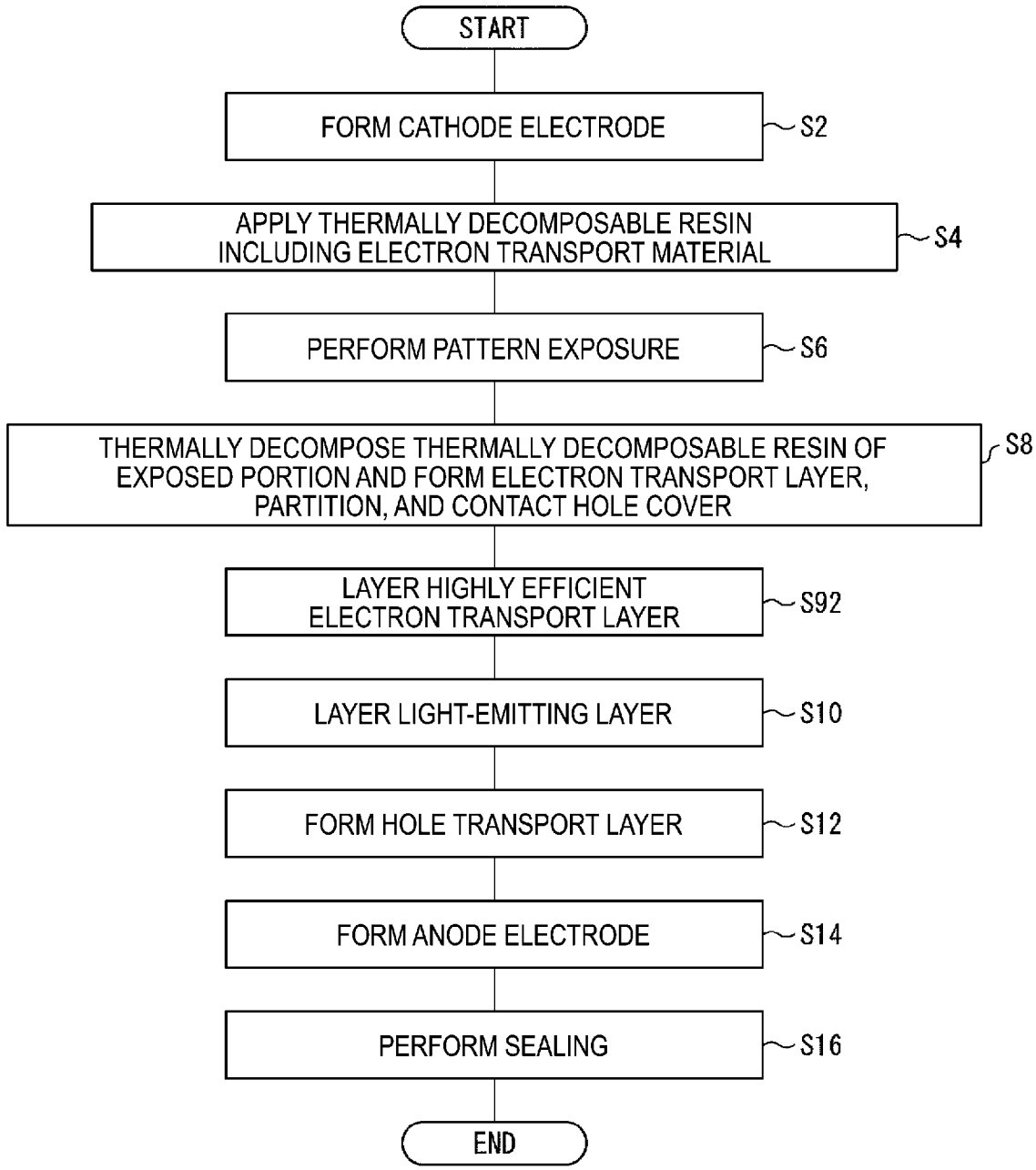
FIG. 22 is a flowchart illustrating the method for manufacturing the display device according to the third embodiment of the disclosure.

As illustrated in FIG. 22, the highly efficient electron transport layer 273 is formed by step S92 of layering at least one layer of the highly efficient electron transport layer 273 formed of the highly efficient charge transport material 72 on the electron transport layer 27 formed similarly to that of the first embodiment. Note that in the example in FIG. 21, only one layer of the highly efficient electron transport layer 273 is formed, but a plurality of the highly efficient electron transport layers 273 may be formed. Steps S10 to S16 (in FIG. 22) after forming the highly efficient electron transport layer 273 are similar to those of the first embodiment. According to the configuration described above, by forming the highly efficient electron transport layer 273 in addition to the electron transport layer 27, the charge transport efficiency can be improved.

Fourth Embodiment

Figure 24:
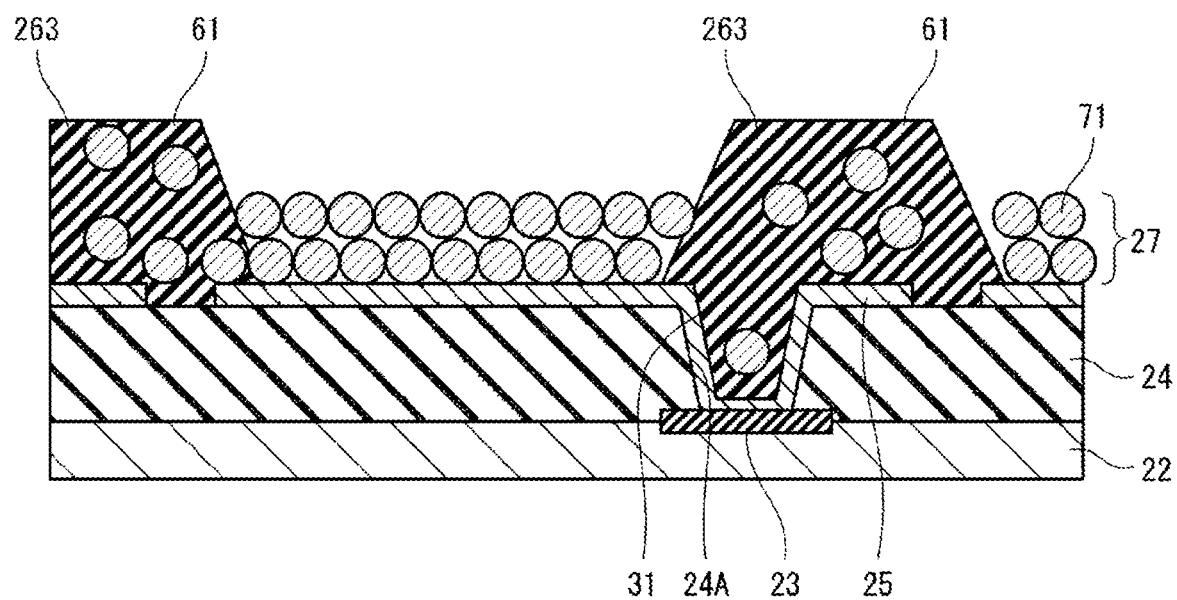
FIG. 24 is a diagram illustrating a state where a part of the thermally decomposable resin illustrated in FIG. 23 has been thermally decomposed and an electron transport layer has been formed.

A fourth embodiment differs from the first embodiment in that, as illustrated in FIG. 24, a partition 263 also covers the cathode electrode 25 in the contact hole 24A. In other words, in the fourth embodiment, a partition and a contact hole cover are integrally formed as the partition 263.

Figure 23:
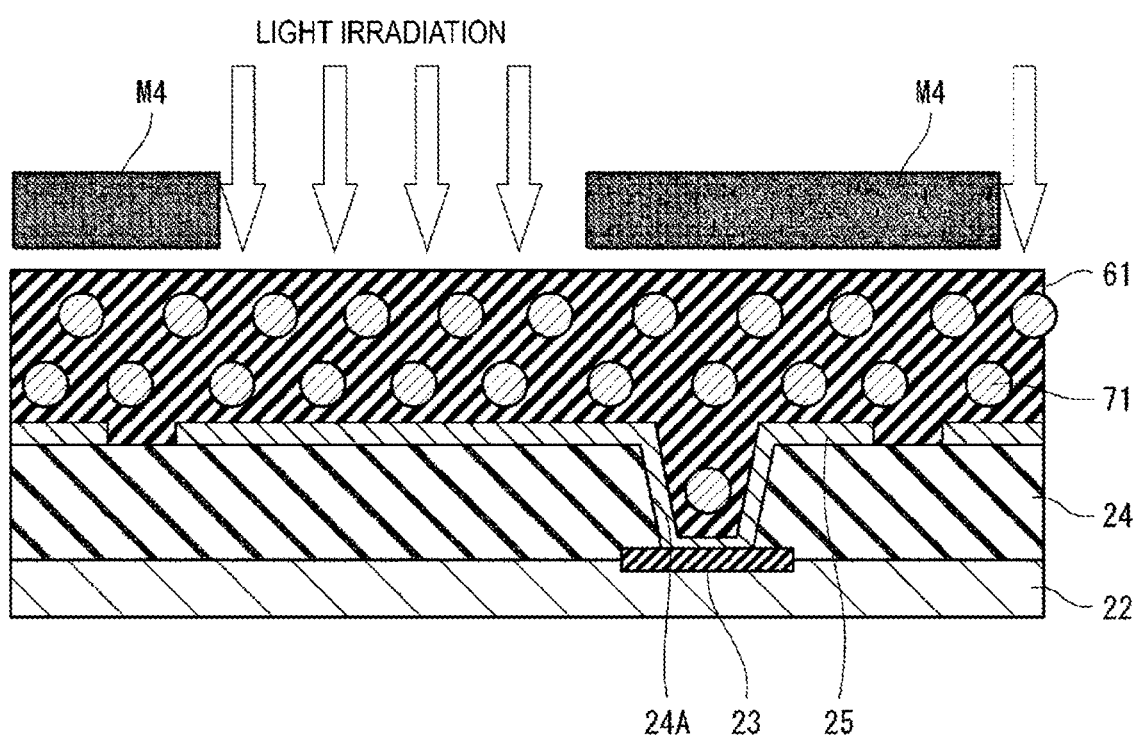
FIG. 23 is a diagram illustrating a state of irradiating the thermally decomposable resin applied as an upper layer above a cathode electrode with light in a method for manufacturing a display device according to a fourth embodiment of the disclosure.

The fourth embodiment will be described below in detail with reference to FIG. 23 to FIG. 27. First, as illustrated in FIG. 23, the thermally decomposable resin 61 applied in a similar manner to that in the first embodiment is irradiated with light through a photomask M4, and the thermally decomposable resin 61 is subjected to pattern exposure (step S6 in FIG. 27). The photomask M4 is disposed so as to continuously cover the edge portion of the cathode electrode 25 and the contact hole 24A.

Figure 27:
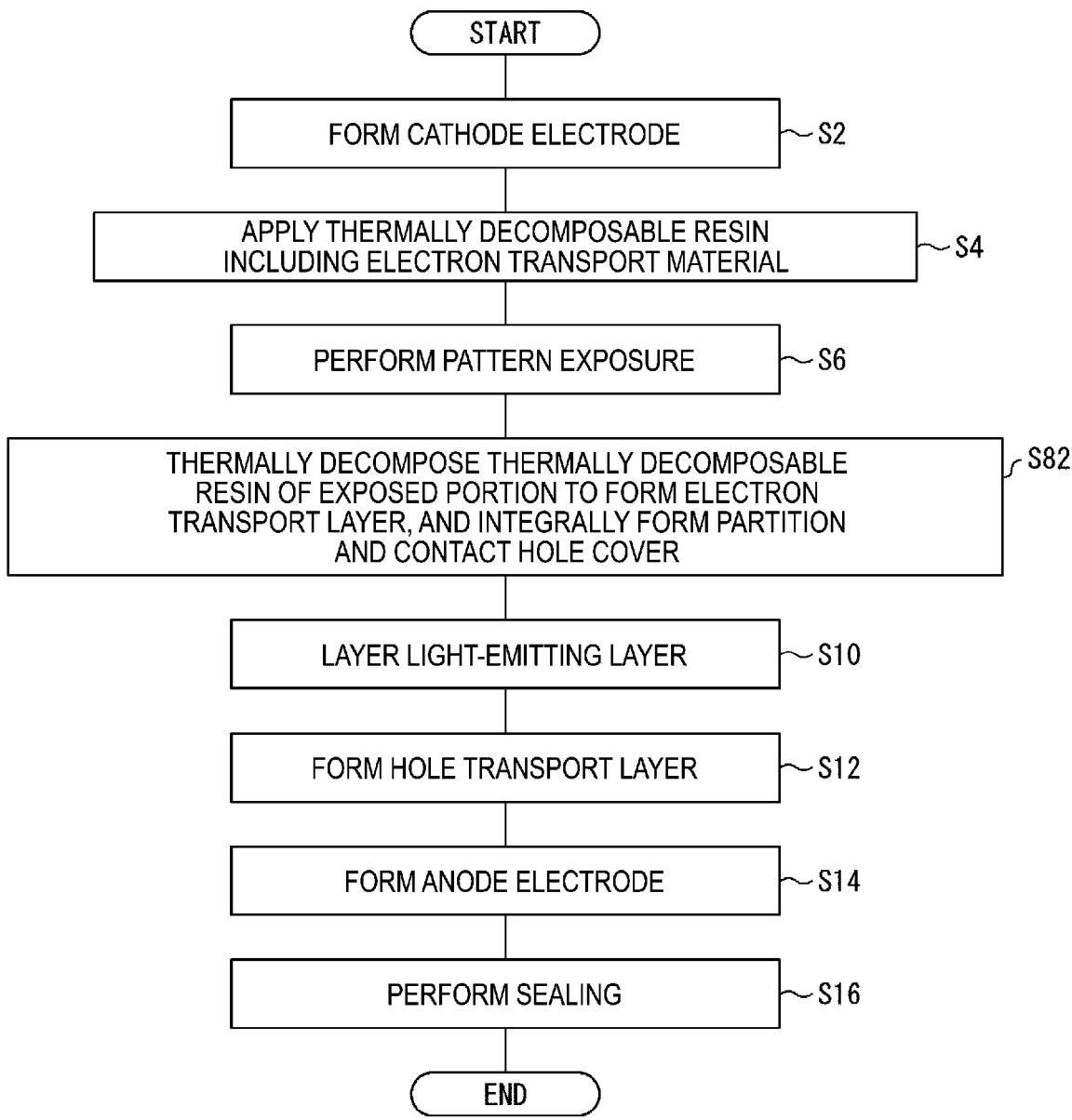
FIG. 27 is a flowchart illustrating the method for manufacturing the display device according to the fourth embodiment of the disclosure.

Next, as illustrated in FIG. 24, the thermally decomposable resin 61 is heated and the thermally decomposable resin 61 of the exposed portion is thermally decomposed to form the electron transport layer 27, and the partition 263 with which a contact hole cover is integrally formed is formed (step S82 in FIG. 27: decomposition processing).

Figure 25:
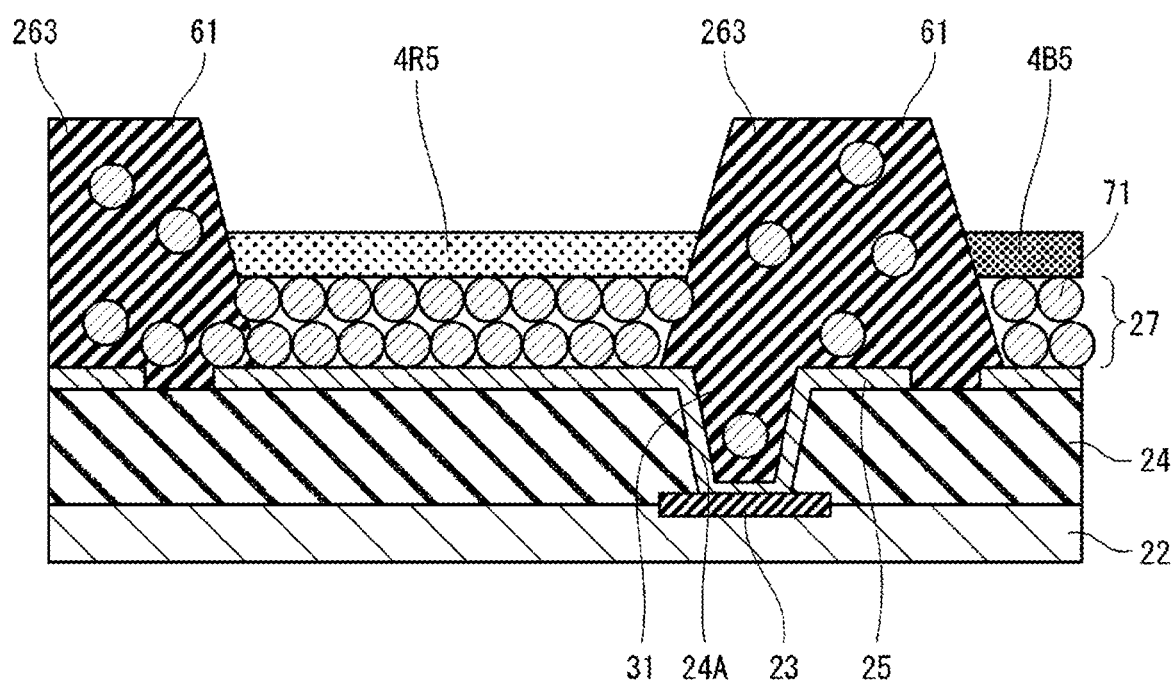
FIG. 25 is a diagram illustrating a state where a light-emitting layer has been layered as an upper layer above the electron transport layer illustrated in FIG. 24 by an ink-jet method.
Figure 26:
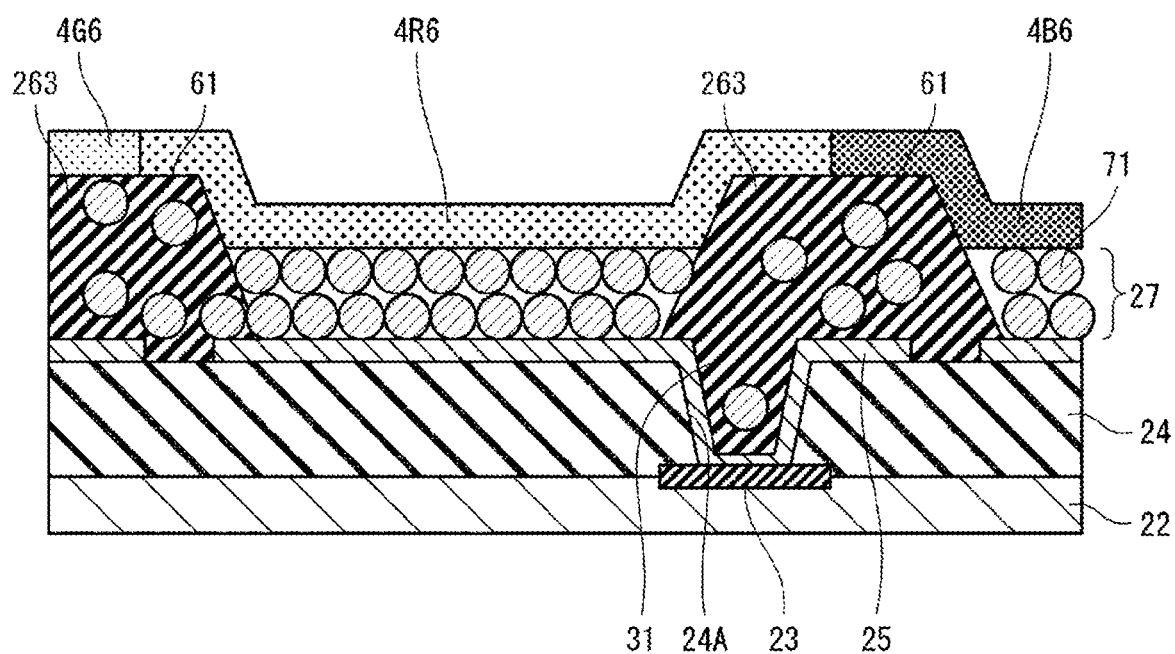
FIG. 26 is a diagram illustrating a state where a light-emitting layer has been layered as an upper layer above the electron transport layer illustrated in FIG. 24 by a QD photoresist method.

Next, as illustrated in FIG. 25, a red light-emitting layer 4R5, a blue light-emitting layer 4B5, and a green light-emitting layer (not illustrated) are layered on the electron transport layer 27 by an ink-jet method (step S10 in FIG. 27). Alternatively, as illustrated in FIG. 26, a light-emitting layer 4R6, 4G6, 4B6 may be layered on the electron transport layer 27 by a QD photoresist method similar to that of the second embodiment. Steps S12 to S16 after forming the light-emitting layer (FIG. 27) are similar to those of the first embodiment.

In the fourth embodiment, as the partition 263, the partition and the contact hole cover are integrally formed, and thus, a patterning resolution required in steps S6 and S82 in FIG. 27 is lower than that in the first embodiment. Thus, even when the display device 21 is highly refined and the distance between the subpixels SP illustrated in FIG. 1 is shortened, the partition 263 that functions as the partition and the contact hole cover can be relatively easily formed.

Further, in the first embodiment, as illustrated in FIG. 4, the portion of the thermally decomposable resin 61 applied to the contact hole 24A is also subjected to pattern exposure. Thus, in order to form the contact hole cover 31 illustrated in FIG. 5, it is necessary to control the heating temperature and the heating time in step S8 in FIG. 10. On the other hand, in the fourth embodiment, since it is not necessary to divide the partition 263 and the contact hole cover, decomposition conditions of the thermally decomposable resin 61 for forming the partition 263 integrally formed with the contact hole cover are relaxed in step S82 in FIG. 27. As a result, the partition 263 that functions as the partition and the contact hole cover can be more easily formed.

Fifth Embodiment

Figure 28:
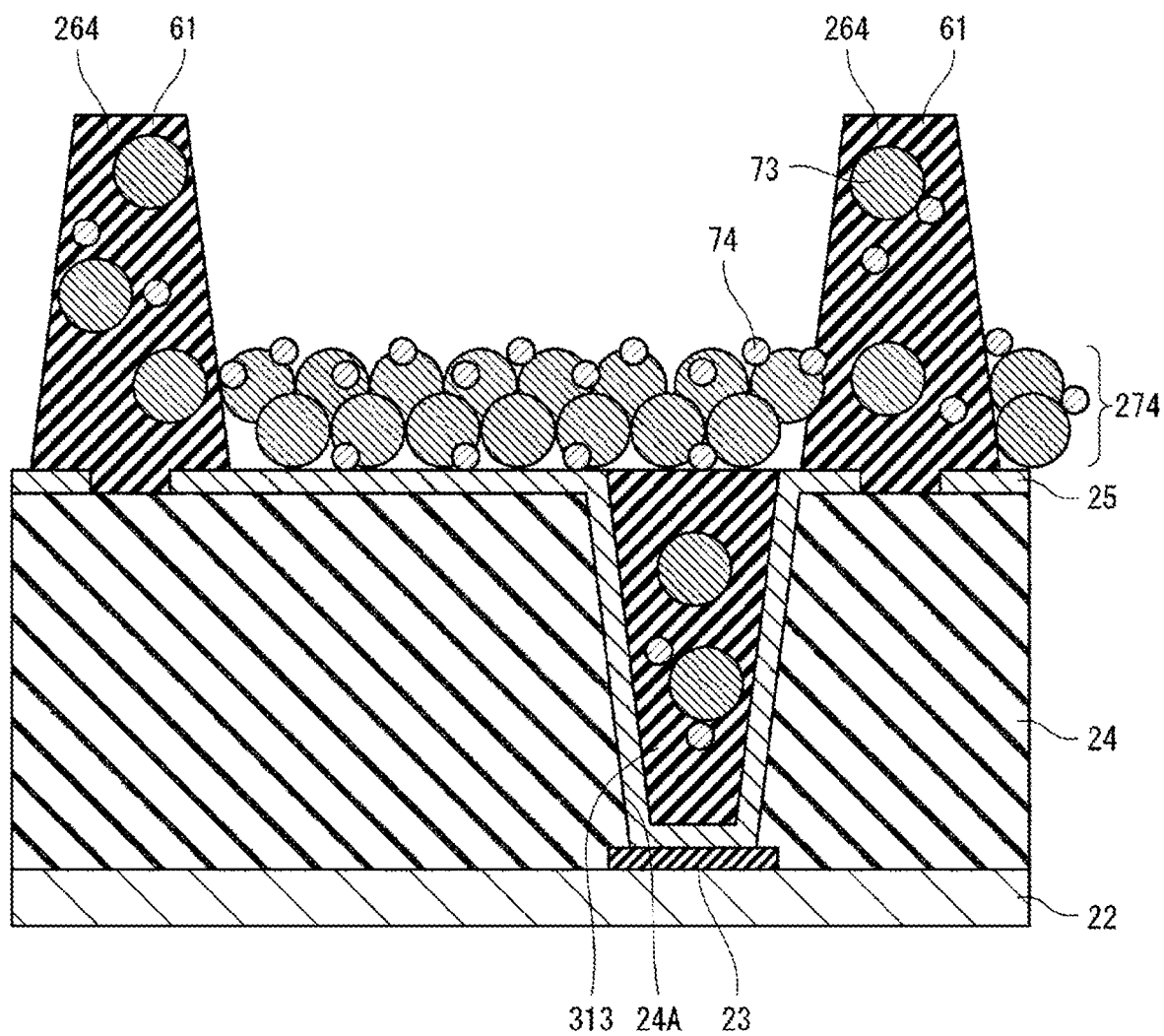
FIG. 28 is a diagram illustrating a state where an electron transport layer including a charge transport material and a charge transport material for space filling has been formed as an upper layer above a cathode electrode in a method for manufacturing a display device according to a fifth embodiment of the disclosure.
Figure 29:
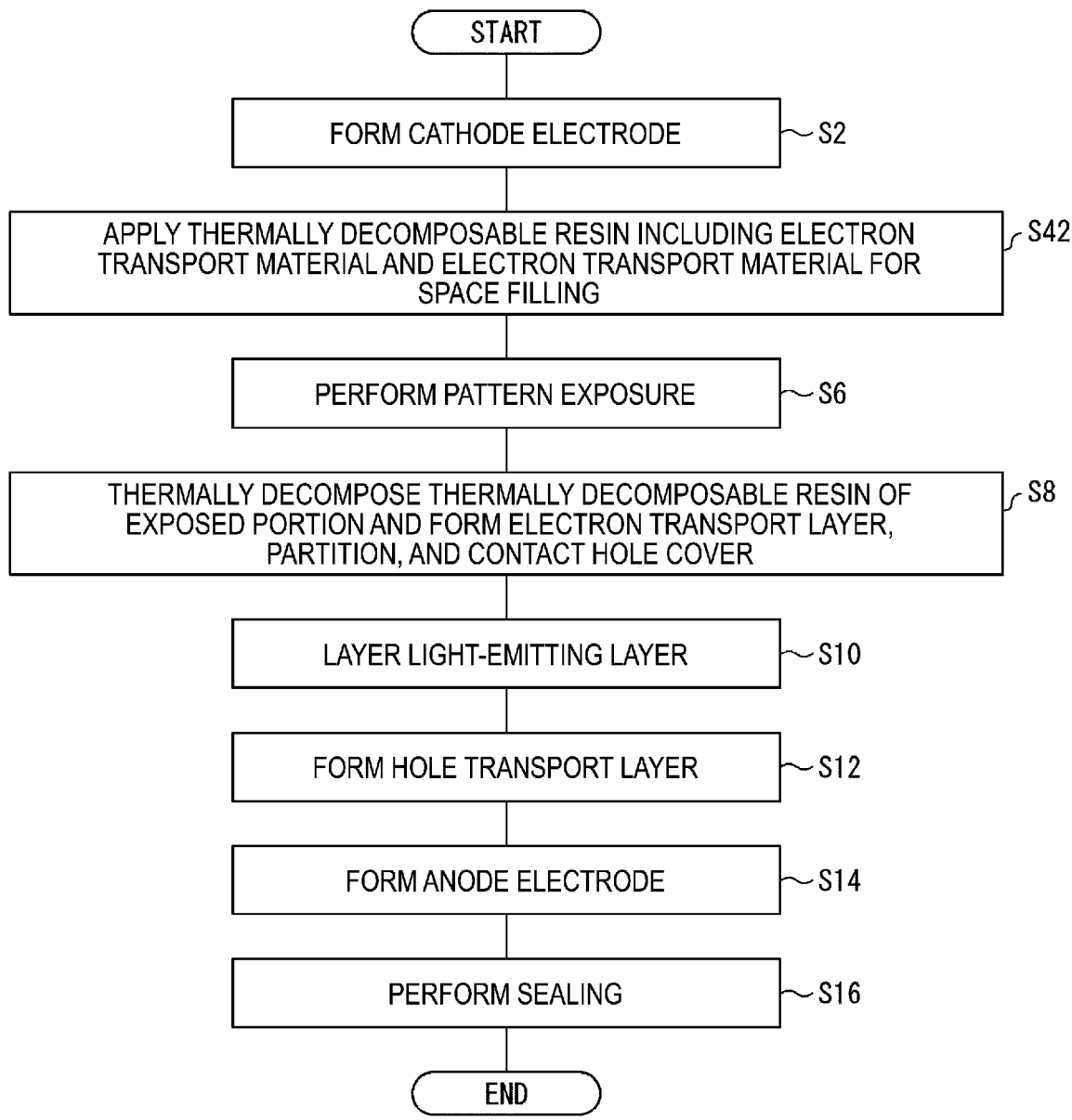
FIG. 29 is a flowchart illustrating the method for manufacturing the display device according to the fifth embodiment of the disclosure.

A fifth embodiment differs from the first embodiment in that, as illustrated in FIG. 28, the thermally decomposable resin 61 includes an electron transport material 73 (charge transport material) and an electron transport material for space filling 74 (charge transport material for space filling). With reference to FIG. 28 and FIG. 29, the fifth embodiment will be described below.

First, the thermally decomposable resin 61 including the electron transport material 73 and the electron transport material for space filling 74 is applied to the cathode electrode 25 formed similarly to that of the first embodiment (step S42 in FIG. 29). As the electron transport material 73 and the electron transport material for space filling 74, a material similar to that of the electron transport material 71 described in the first embodiment can be used. Also, a material of the electron transport material 73 and a material of the electron transport material for space filling 74 may be the same or different. However, the particle diameter of the electron transport material for space filling 74 is different from the particle diameter of the electron transport material 73.

Next, as in the first embodiment, the thermally decomposable resin 61 is irradiated with light, and the thermally decomposable resin 61 is subjected to pattern exposure (step S6 in FIG. 29). Then, the thermally decomposable resin 61 is heated and the thermally decomposable resin 61 of the exposed portion is thermally decomposed to form an electron transport layer 274, a partition 264, and a contact hole cover 313 that are illustrated in FIG. 28 (step S8 in FIG. 29). The electron transport layer 274 includes the electron transport material 73 and the electron transport material for space filling 74, so its space filling rate is high. Thus, the electron transport layer 274 with high electron transport efficiency can be implemented. Steps S10 to S16 after forming the electron transport layer 274 (in FIG. 29) are similar to those of the first embodiment.

According to the configuration described above, the space filling rate of the electron transport material 73 and the electron transport material for space filling 74 in the electron transport layer 274 can be increased, and thus, the electron transport layer 274 having high charge transport efficiency can be implemented.

Sixth Embodiment

Figure 31:
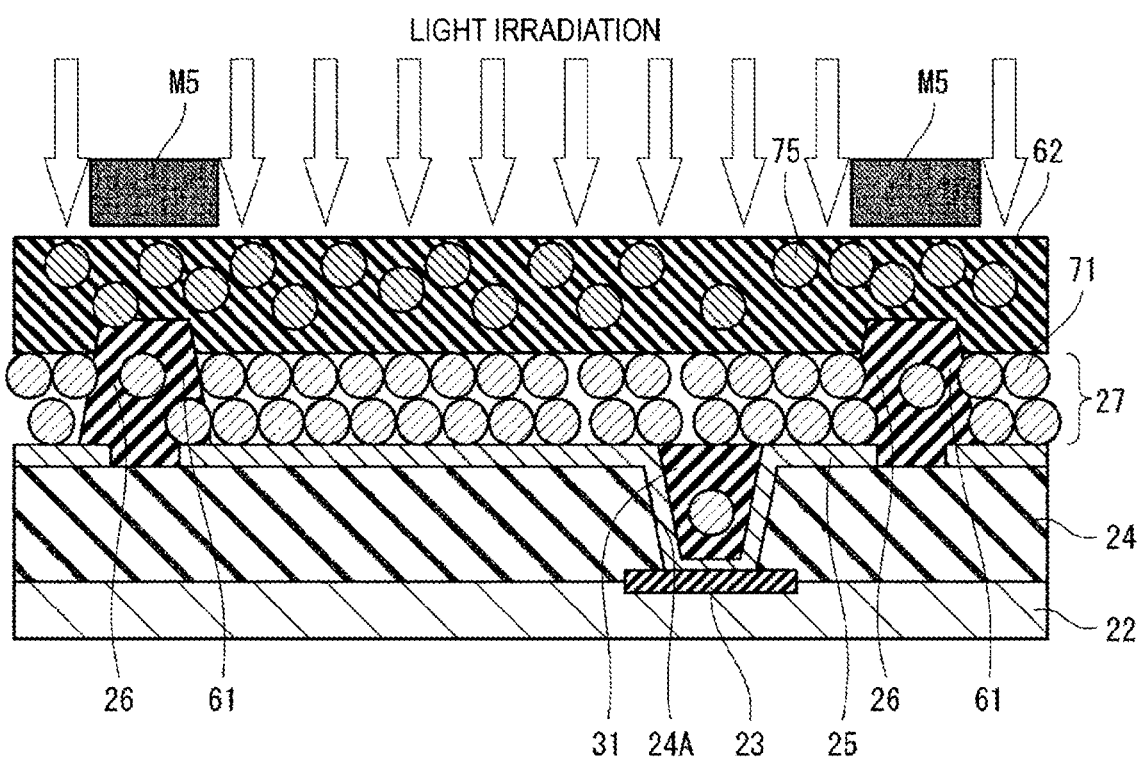
FIG. 31 is a diagram illustrating a state of irradiating the supplemental thermally decomposable resin illustrated in FIG. 30 with light.
Figure 32:
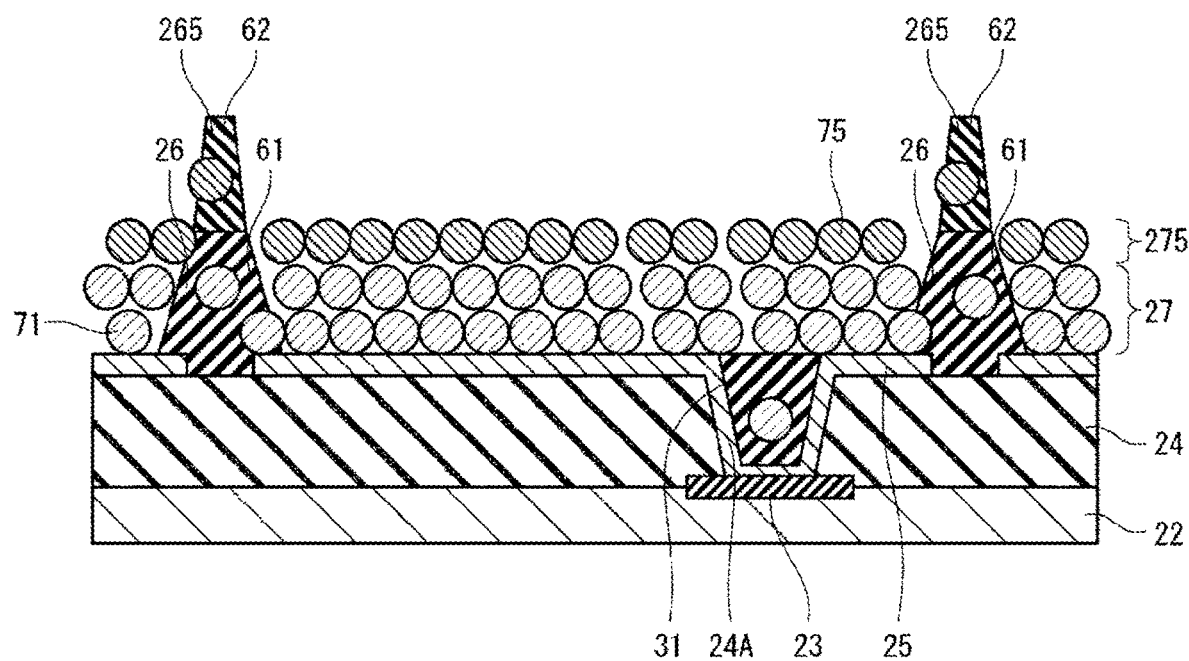
FIG. 32 is a diagram illustrating a state where a part of the supplemental thermally decomposable resin illustrated in FIG. 31 has been thermally decomposed and a supplemental electron transport layer has been formed.

A sixth embodiment differs from the first embodiment in that, as illustrated in FIG. 32, a supplemental electron transport layer 275 (supplemental charge transport layer) is formed on the electron transport layer 27, and a supplemental partition 265 is formed on the partition 26. Hereinafter, the sixth embodiment will be described in detail with reference to FIG. 30 to FIG. 33.

Figure 30:
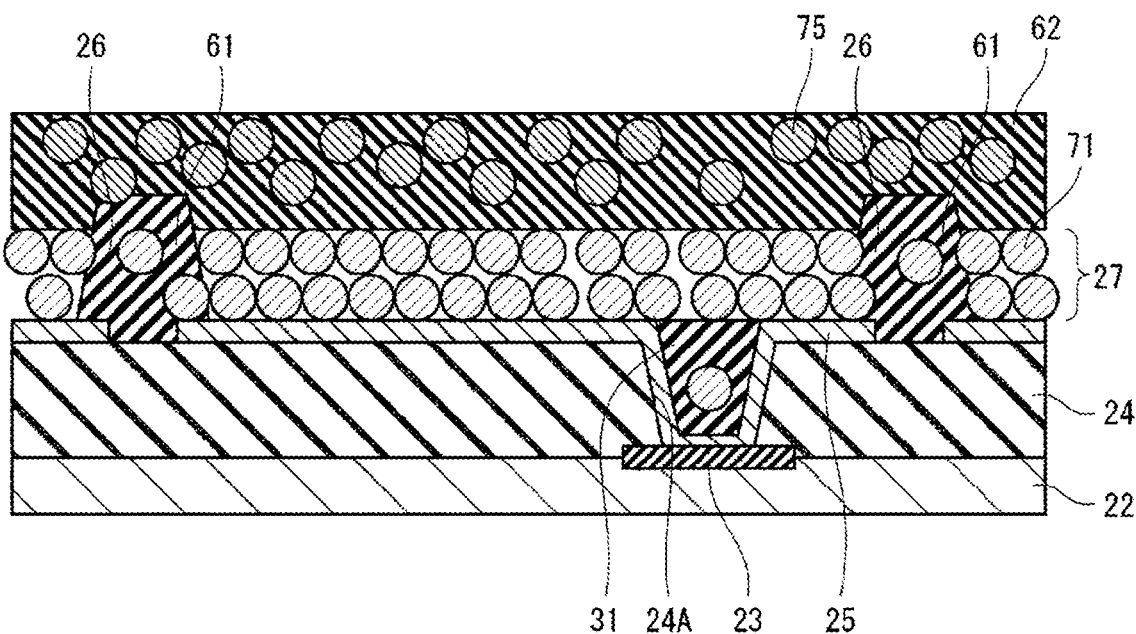
FIG. 30 is a diagram illustrating a state where a supplemental thermally decomposable resin has been applied as an upper layer above an electron transport layer and a partition in a method for manufacturing a display device according to a sixth embodiment of the disclosure.
Figure 33:
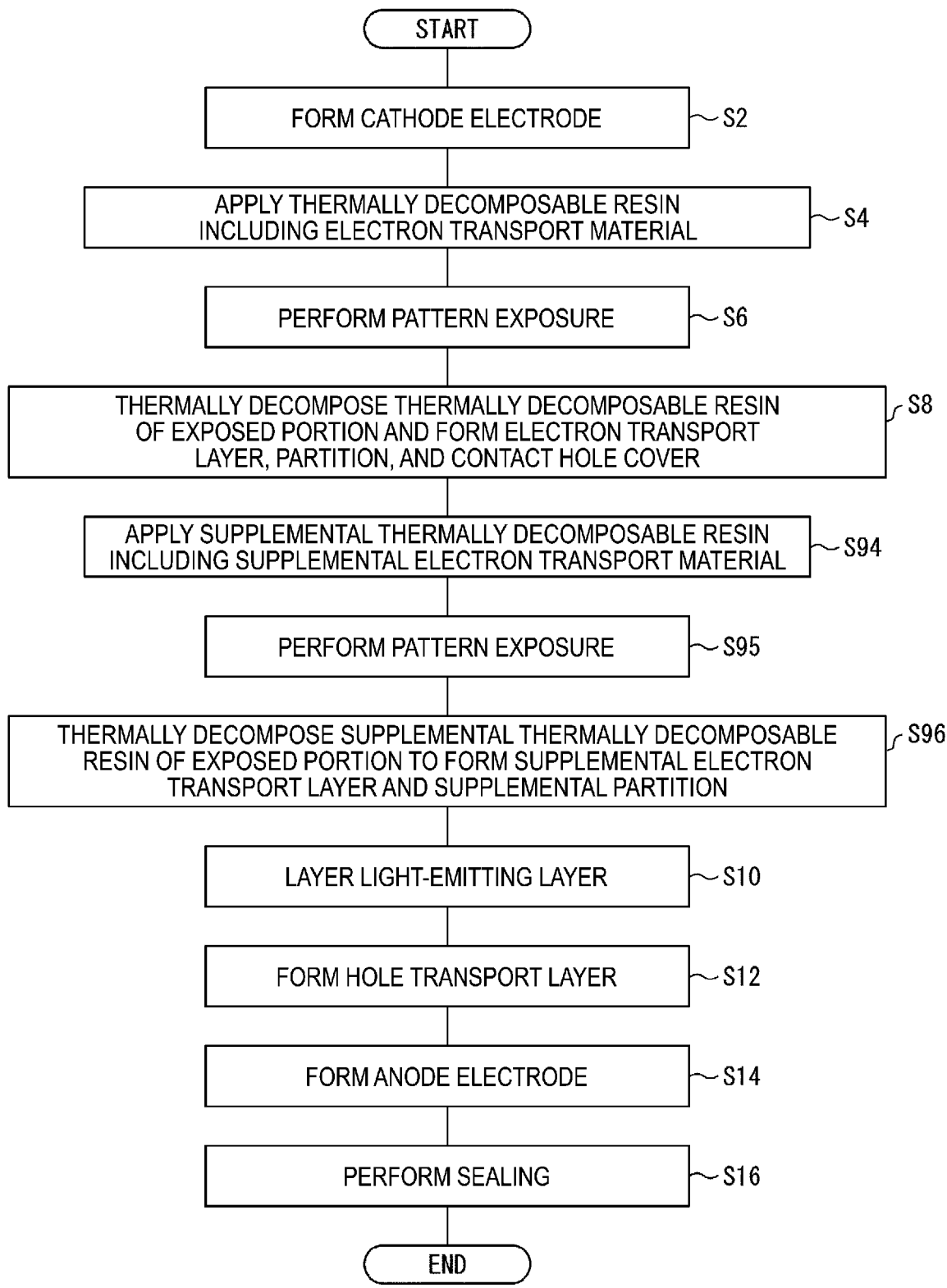
FIG. 33 is a flowchart illustrating the method for manufacturing the display device according to the sixth embodiment of the disclosure.

First, as illustrated in FIG. 30, a supplemental thermally decomposable resin 62 including a supplemental electron transport material 75 (supplemental charge transport material) is applied to the electron transport layer 27 and the partition 26 formed similarly to those of the first embodiment (step S94 in FIG. 33). The supplemental electron transport material 75 is a different material from the electron transport material 71 and contributes to the improvement of electron transport efficiency. Further, for the supplemental thermally decomposable resin 62, a material similar to that of the thermally decomposable resin 61 can be used. The supplemental thermally decomposable resin 62 may be the same as or different from the thermally decomposable resin 61.

The volume ratio between the supplemental electron transport material 75 and the supplemental thermally decomposable resin 62 may be the same as or different from the volume ratio between the electron transport material 71 and the thermally decomposable resin 61. For example, the volume ratio of the supplemental electron transport material 75 with respect to the supplemental thermally decomposable resin 62 may be higher than the volume ratio of the electron transport material 71 with respect to the thermally decomposable resin 61. In this case, the thermally decomposable resin 61 as a lower layer ensures the insulating properties of the partition 26 and the contact hole cover 31, and then, the supplemental electron transport layer 275 as an upper layer, which will be described below, can achieve electron transport with high efficiency.

Next, as illustrated in FIG. 31, the supplemental thermally decomposable resin 62 is irradiated with light through a photomask M5, and the supplemental thermally decomposable resin 62 is subjected to pattern exposure (step S95 in FIG. 33). The photomask M5 is disposed to cover the edge portions of the plurality of cathode electrodes 25. The supplemental partition 265, which will be described later, is formed at a position where the photomask M5 is disposed.

Next, as illustrated in FIG. 32, the supplemental thermally decomposable resin 62 is heated and the supplemental thermally decomposable resin 62 of the exposed portion is thermally decomposed to form the supplemental electron transport layer 275 and the supplemental partition 265 (step S96 in FIG. 33). Steps S10 to S16 (in FIG. 33) after forming the supplemental electron transport layer 275 and the supplemental partition 265 are similar to those in the first embodiment.

In the sixth embodiment, electron transport efficiency can be improved due to the supplemental electron transport layer 275. Additionally, the entire height of the partition 26 and the supplemental partition 265 can be increased due to the supplemental partition 265, and thus, for example, the light-emitting layer (not illustrated) can be easily formed by an inkjet method. Since the supplemental electron transport layer 275 and the supplemental partition 265 can be collectively formed, it is possible to reduce manufacturing man-hours.

Note that, in the sixth embodiment, each of the supplemental electron transport layer 275 and the supplemental partition 265 is formed as one layer, but a plurality of the supplemental electron transport layers 275 and the supplemental partitions 265 may be formed by repeating steps S94 to S96 in FIG. 33.

Seventh Embodiment

Figure 35:
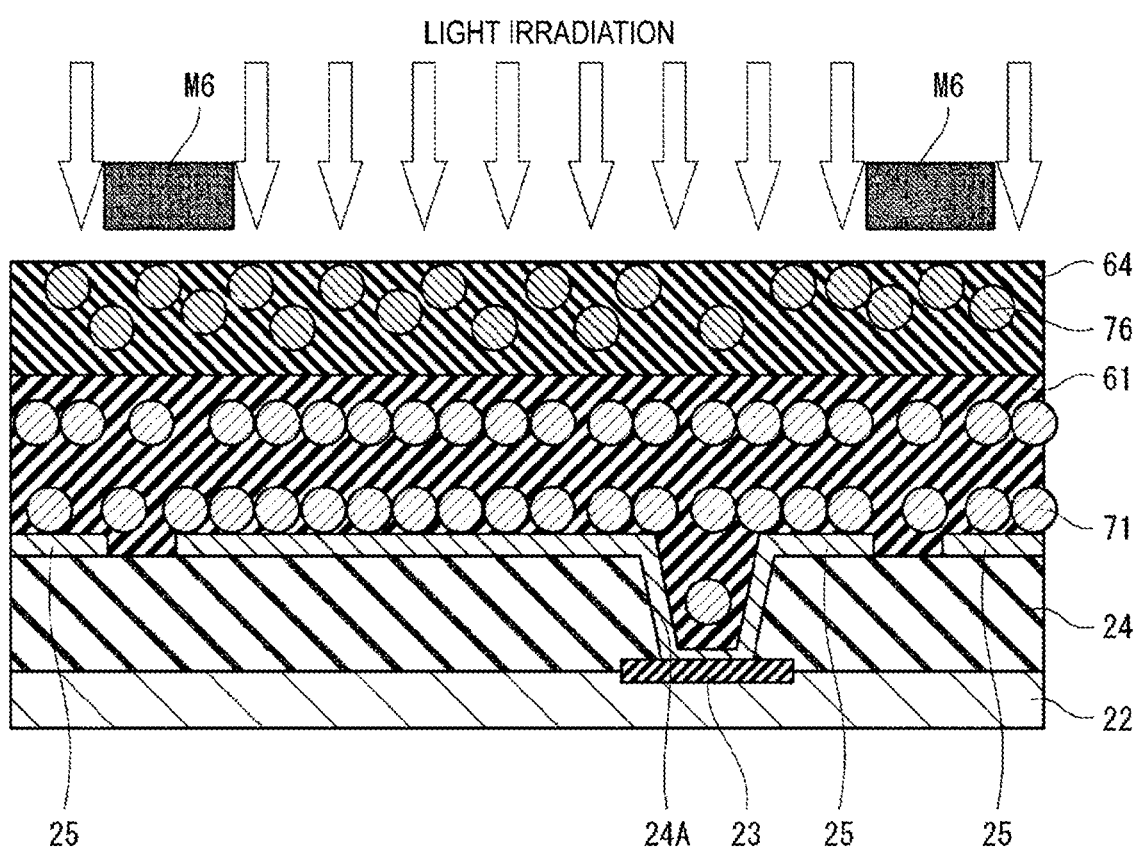
FIG. 35 is a diagram illustrating a state of irradiating the thermally decomposable resin and the supplemental thermally decomposable resin illustrated in FIG. 34 with light.
Figure 36:
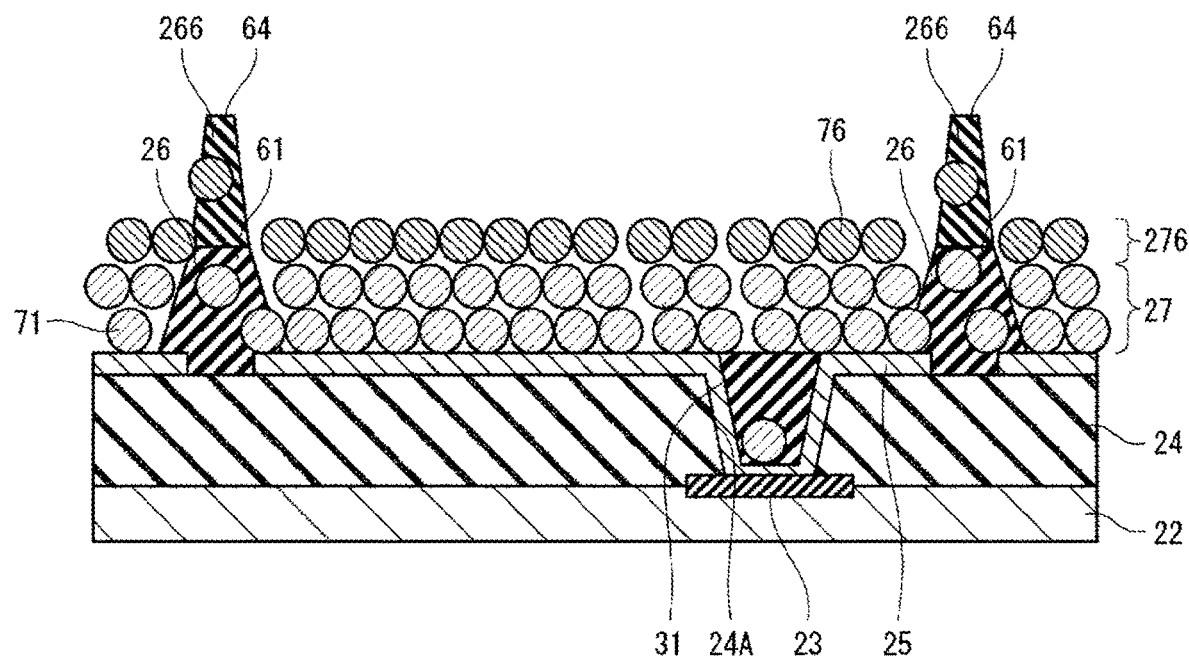
FIG. 36 is a diagram illustrating a state where a part of the thermally decomposable resin and the supplemental thermally decomposable resin illustrated in FIG. 35 has been thermally decomposed, and an electron transport layer and a supplemental electron transport layer have been formed.
Figure 37:
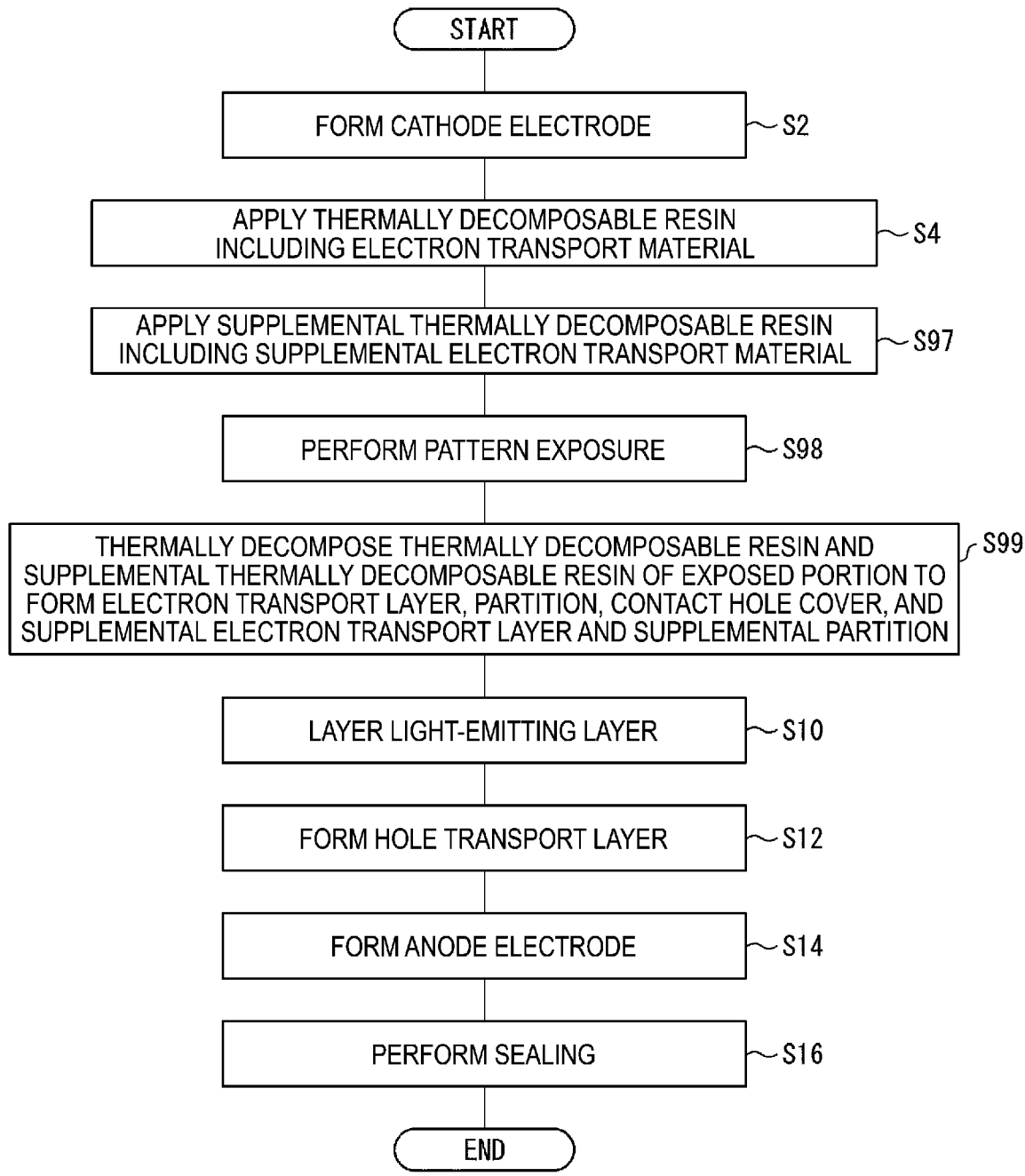
FIG. 37 is a flowchart illustrating the method for manufacturing the display device according to the seventh embodiment of the disclosure.

A seventh embodiment differs from the first embodiment in that, as illustrated in FIG. 36, a supplemental electron transport layer 276 (supplemental charge transport layer) is formed on the electron transport layer 27, and a supplemental partition 266 is formed on the partition 26. Further, the seventh embodiment differs from the sixth embodiment in that, as illustrated in FIG. 37, supplemental coating step S97 is included in which the thermally decomposable resin 61 applied in step S4 is applied with the supplemental thermally decomposable resin 64 including the supplemental electron transport material 76 (supplemental charge transport material) illustrated in FIG. 34. Hereinafter, the seventh embodiment will be described in detail with reference to FIG. 34 to FIG. 37.

Figure 34:
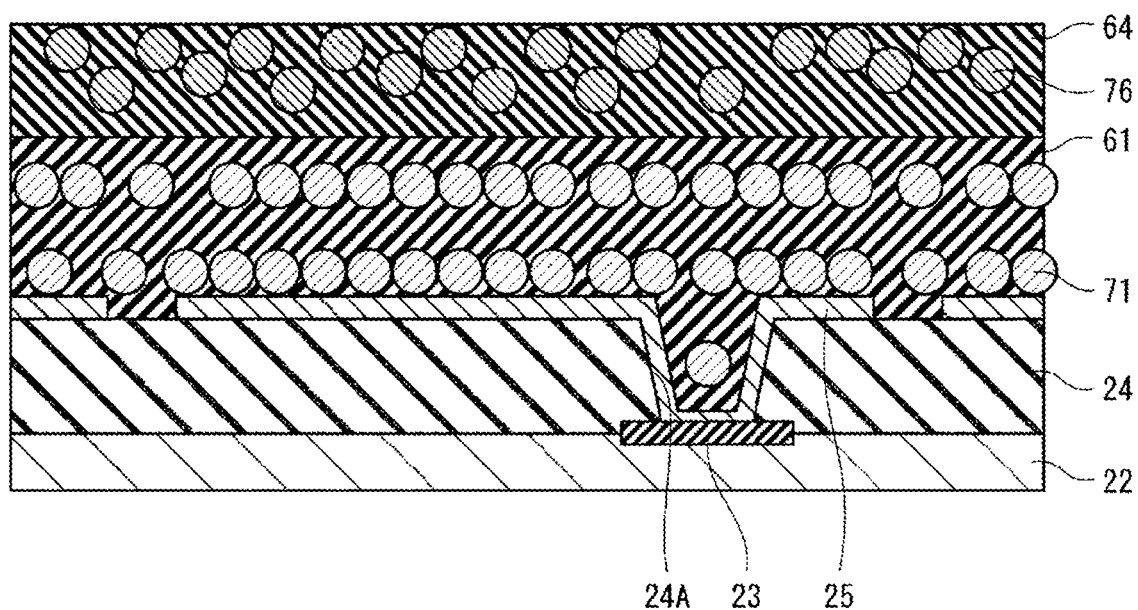
FIG. 34 is a diagram illustrating a state where supplemental thermally decomposable resin has been applied as an upper layer above thermally decomposable resin in a method for manufacturing a display device according to a seventh embodiment of the disclosure.

First, as illustrated in FIG. 34, the supplemental thermally decomposable resin 64 including the supplemental electron transport material 76 is applied to the thermally decomposable resin 61 including the electron transport material 71 applied similarly to step S4 (in FIG. 10) of the first embodiment (step S97 in FIG. 37). The supplemental electron transport material 76 is a different material from the electron transport material 71 and contributes to the improvement of electron transport efficiency. Further, as the supplemental thermally decomposable resin 64, a material similar to that of the thermally decomposable resin 61 can be used. The supplemental thermally decomposable resin 64 may be the same as or different from the thermally decomposable resin 61.

A volume ratio between the supplemental electron transport material 76 and the supplemental thermally decomposable resin 64 may be the same as or different from the volume ratio between the electron transport material 71 and the thermally decomposable resin 61. For example, the volume ratio of the supplemental electron transport material 76 with respect to the supplemental thermally decomposable resin 64 may be higher than the volume ratio of the electron transport material 71 with respect to the thermally decomposable resin 61. In this case, the thermally decomposable resin 61 as a lower layer ensures the insulating properties of the partition 26 and the contact hole cover 31, and then, the supplemental electron transport layer 276 as an upper layer, which will be described below, can achieve electron transport with high efficiency.

Next, as illustrated in FIG. 35, the thermally decomposable resin 61 and the supplemental thermally decomposable resin 64 are irradiated with light through a photomask M6, and the thermally decomposable resin 61 and the supplemental thermally decomposable resin 64 are subjected to pattern exposure (step S98 in FIG. 37). The photomask M6 is disposed to cover the edge portions of the plurality of cathode electrodes 25. The partition 26 and the supplemental partition 266, which will be described later, are formed at a position where the photomask M6 is disposed.

Next, as illustrated in FIG. 36, the thermally decomposable resin 61 and the supplemental thermally decomposable resin 64 are heated, and the thermally decomposable resin 61 and the supplemental thermally decomposable resin 64 of the exposed portion are thermally decomposed to form the electron transport layer 27, the partition 26 and the contact hole cover 31, and the supplemental electron transport layer 276 and the supplemental partition 266 (step S99 in FIG. 37). Subsequent steps S10 to S16 (in FIG. 37) are similar to those of the first embodiment.

In the seventh embodiment, electron transport efficiency can be improved due to the supplemental electron transport layer 276. In addition, since the entire height of the partition 26 and the supplemental partition 266 can be increased due to the supplemental partition 266, for example, the light-emitting layer (not illustrated) can be easily formed by an ink-jet method. Since the electron transport layer 27, the partition 26 and the contact hole cover 31, and the supplemental electron transport layer 276 and the supplemental partition 266 can be collectively formed, the manufacturing man-hours can be reduced.

Note that, in the seventh embodiment, each of the supplemental electron transport layer 276 and the supplemental partition 266 is formed as one layer, but a plurality of the supplemental electron transport layers 276 and the supplemental partitions 266 may be formed by repeating step S97 in FIG. 37.

Modified Example of Seventh Embodiment

Figure 38:
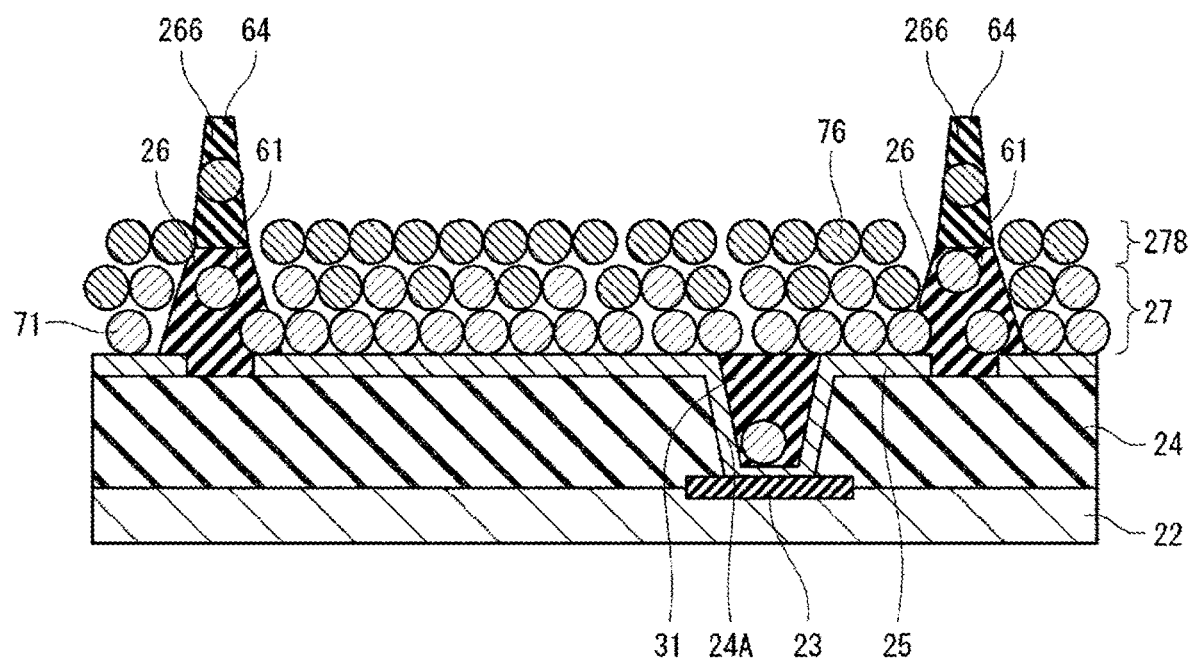
FIG. 38 is a diagram illustrating a state where a supplemental electron transport layer has been formed as an upper layer above an electron transport layer in a method for manufacturing a display device according to a modified example of the seventh embodiment of the disclosure.

In FIG. 36, the electron transport material 71 constituting the electron transport layer 27 and the supplemental electron transport material 76 constituting the supplemental electron transport layer 276 are separated from each other. However, as illustrated in FIG. 38, at a boundary between the electron transport layer 27 and a supplemental electron transport layer 278, a plurality of electron transport materials 71 and a plurality of supplemental electron transport materials 76 may be mixed with each other. In other words, in the decomposition processing step S99 in FIG. 37, the position of the lower end of one disposed at the lowest position among the plurality of supplemental electron transport materials 76 may be lower than the position of the upper end of one disposed at the highest position among the plurality of electron transport materials 71. In this case, the electron transport material 71 and the supplemental electron transport material 76 can be easily brought into proximity to each other, and thus, electron transport efficiency can be easily improved.

Eighth Embodiment

Figure 41:
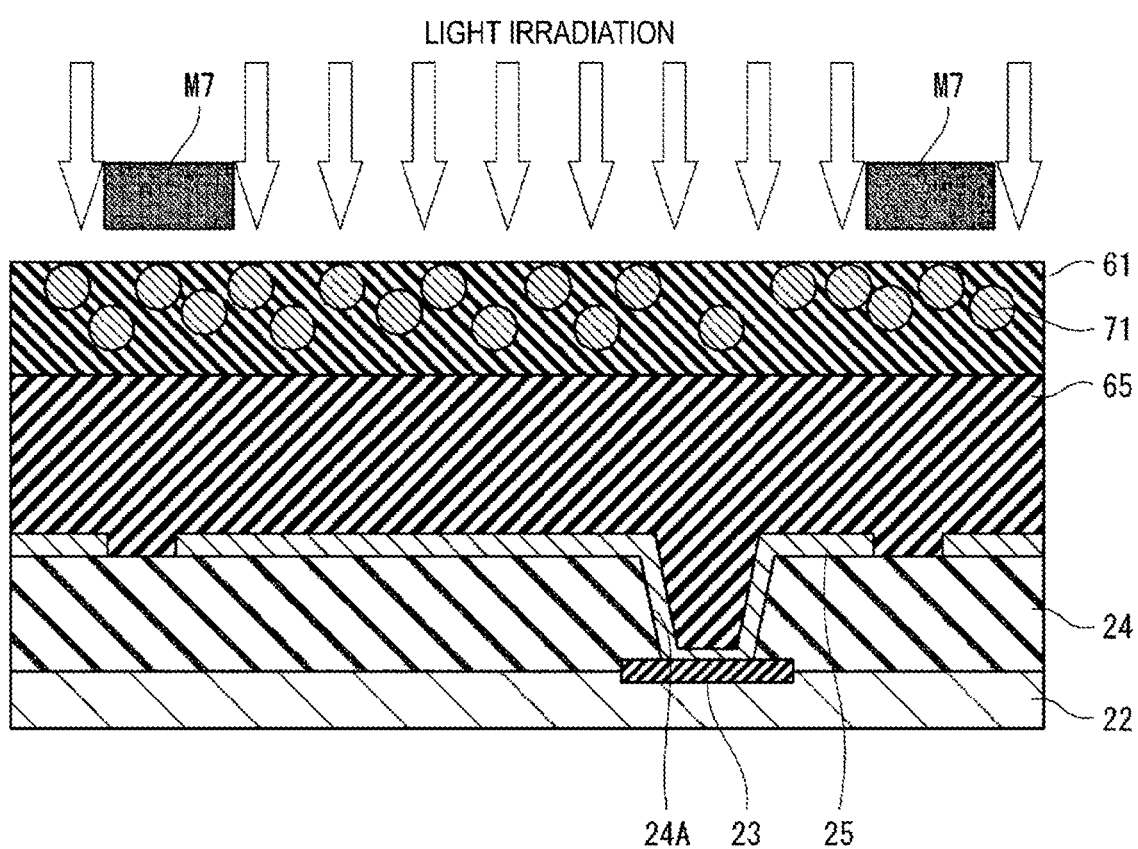
FIG. 41 is a diagram illustrating a state of irradiating the thermally decomposable insulating resin and the thermally decomposable resin illustrated in FIG. 40 with light.
Figure 42:
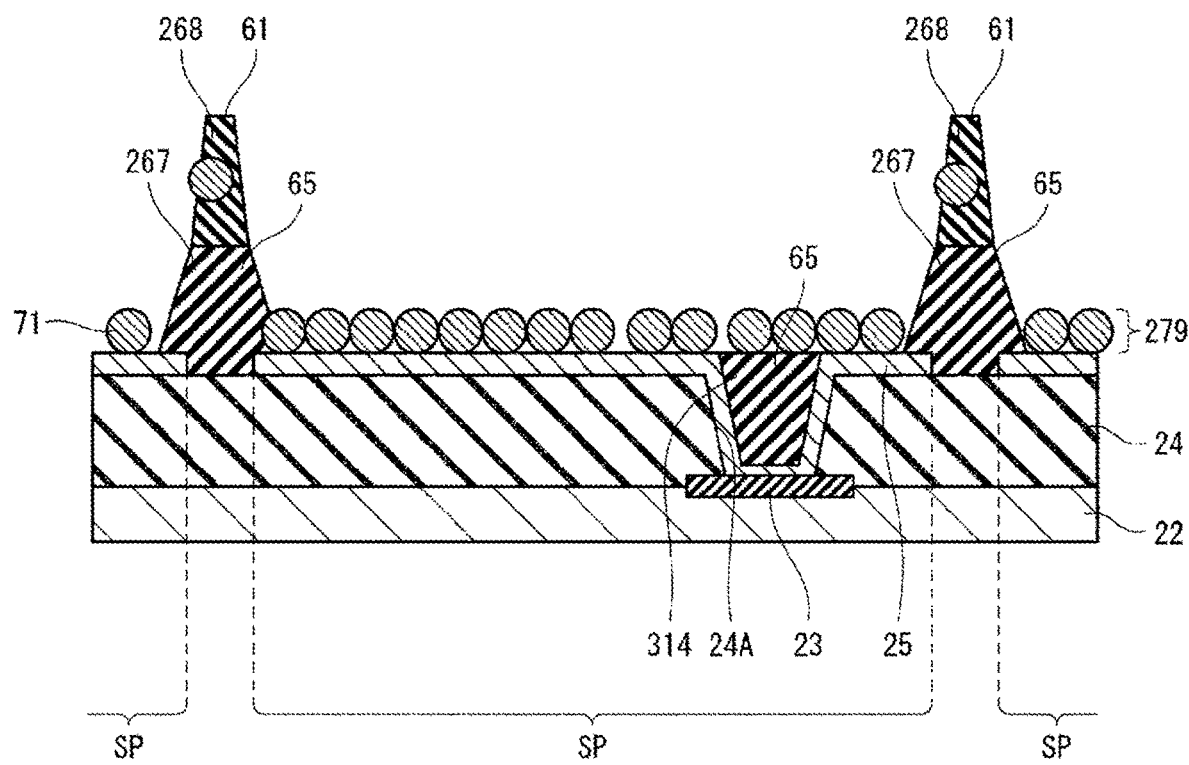
FIG. 42 is a diagram illustrating a state where a part of the thermally decomposable insulating resin and the thermally decomposable resin illustrated in FIG. 41 has been thermally decomposed and an electron transport layer has been formed.

An eighth embodiment differs from the first embodiment, as illustrated in FIG. 42, in that an insulating partition 267 is formed under a partition 268. Hereinafter, the eighth embodiment will be described in detail with reference to FIG. 39 to FIG. 43.

Figure 39:
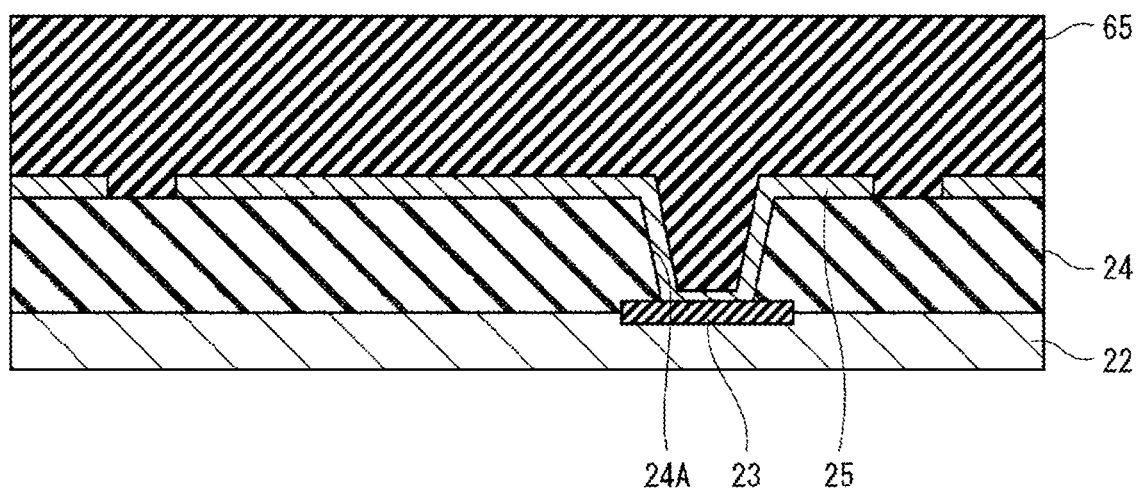
FIG. 39 is a diagram illustrating a state where a thermally decomposable insulating resin has been applied as an upper layer above a cathode electrode in a method for manufacturing a display device according to an eighth embodiment of the disclosure.
Figure 43:
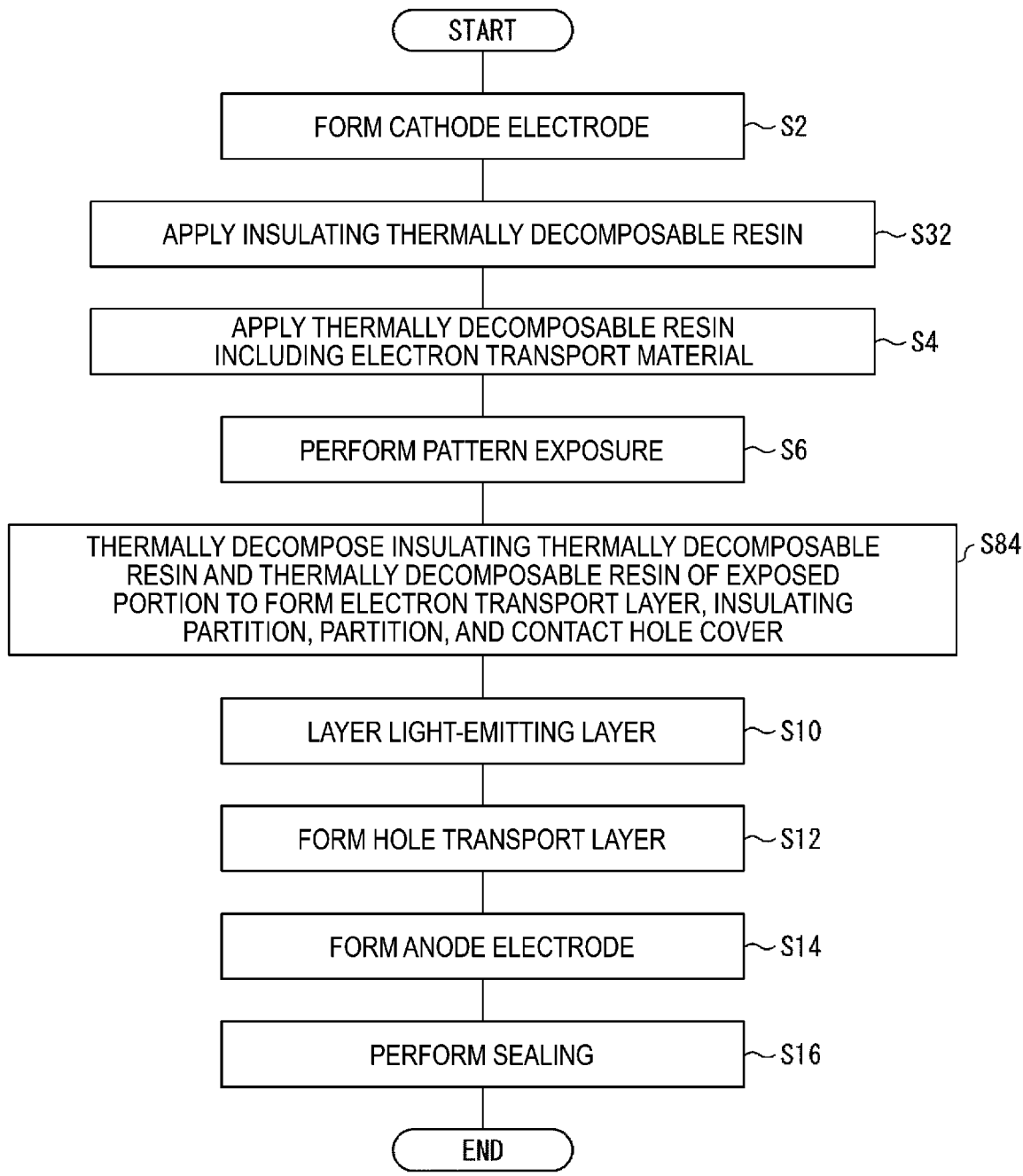
FIG. 43 is a flowchart illustrating the method for manufacturing the display device according to the eighth embodiment of the disclosure.

First, as illustrated in FIG. 39, the thermally decomposable insulating resin 65 is applied to the cathode electrode 25 and the interlayer insulating film 24 that are formed similarly to those of the first embodiment (step S32 in FIG. 43). The thermally decomposable insulating resin 65 is substantially free of electron transport materials, and thus, has high insulating properties. For the thermally decomposable insulating resin 65, a material similar to that of the thermally decomposable resin 61 can be used. The thermally decomposable insulating resin 65 may be the same as or different from the thermally decomposable resin 61.

Figure 40:
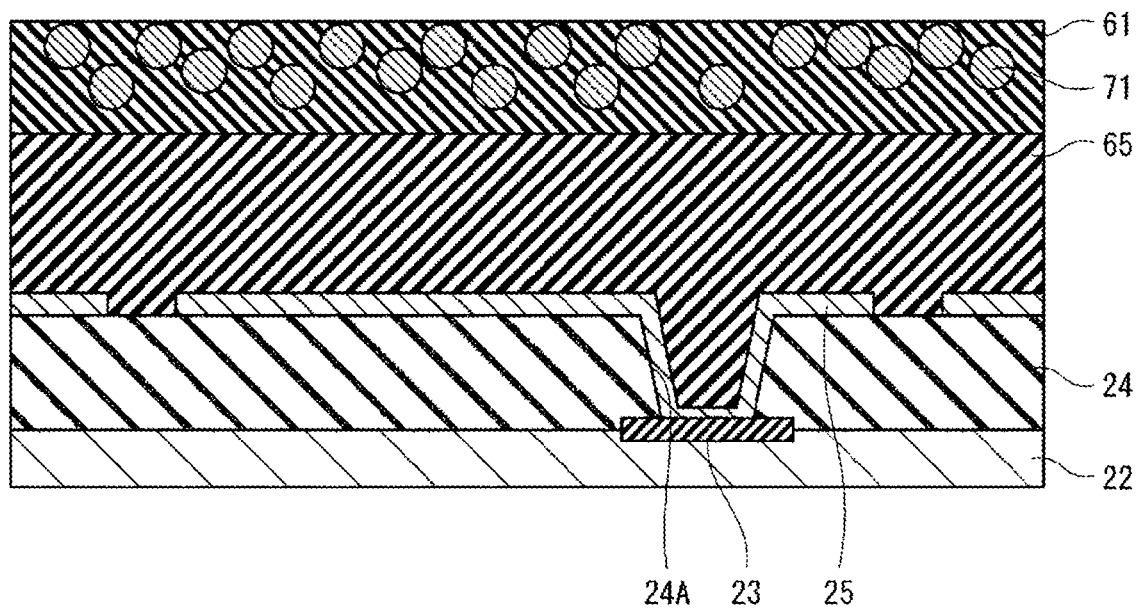
FIG. 40 is a diagram illustrating a state where a thermally decomposable resin has been applied as an upper layer above the thermally decomposable insulating resin illustrated in FIG. 39.

Next, as illustrated in FIG. 40, the thermally decomposable resin 61 including particles of the electron transport material 71 is applied as an upper layer above the thermally decomposable insulating resin 65 (step S4 in FIG. 43). Next, as illustrated in FIG. 41, the thermally decomposable insulating resin 65 and the thermally decomposable resin 61 are irradiated with light through a photomask M7, and the thermally decomposable insulating resin 65 and the thermally decomposable resin 61 are subjected to pattern exposure (step S6 in FIG. 43).

Next, as illustrated in FIG. 42, the thermally decomposable insulating resin 65 and the thermally decomposable resin 61 are heated, and the thermally decomposable insulating resin 65 of the exposed portion and the thermally decomposable resin 61 are thermally decomposed to form an electron transport layer 279, the insulating partition 267, the partition 268, and a contact hole cover 314 (step S84 in FIG. 43). Since the thermally decomposable insulating resin 65 is substantially free of electron transport materials, the insulating partition 267 and the contact hole cover 314 that are formed of the thermally decomposable insulating resin 65 are also substantially free of electron transport materials. Subsequent steps S10 to S16 are similar to those of the first embodiment (in FIG. 43).

In the eighth embodiment, due to the layered structure of the insulating partition 267 and the partition 268, the subpixel SP is separated with a high wall, and thus, crosstalk between adjacent subpixels SP can be prevented. In addition, the electron transport layer 279, the insulating partition 267, and the partition 268 can be collectively formed, and thus, the manufacturing man-hours can be reduced.

Ninth Embodiment

Figure 44:
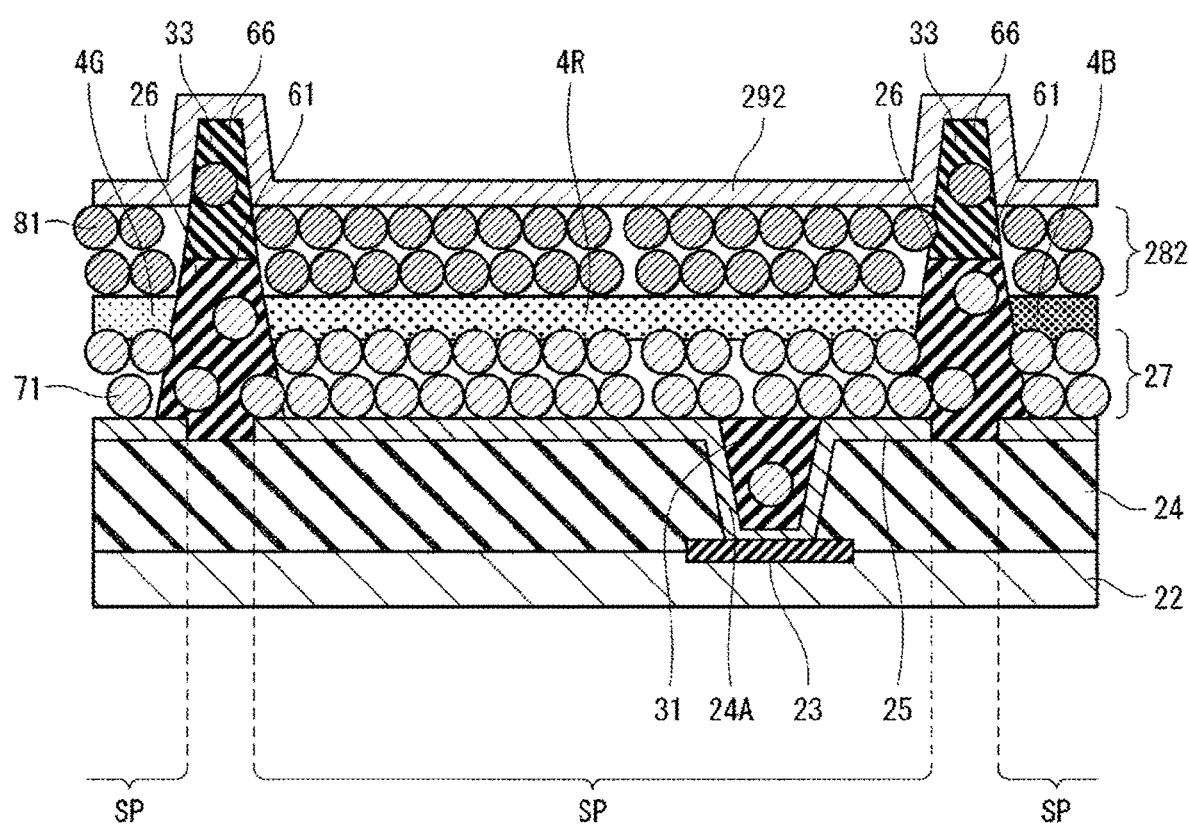
FIG. 44 is a diagram illustrating a state where a hole transport layer and a second partition are respectively formed as upper layers above a light-emitting layer and a partition in a method for manufacturing a display device according to a ninth embodiment of the disclosure.
Figure 45:
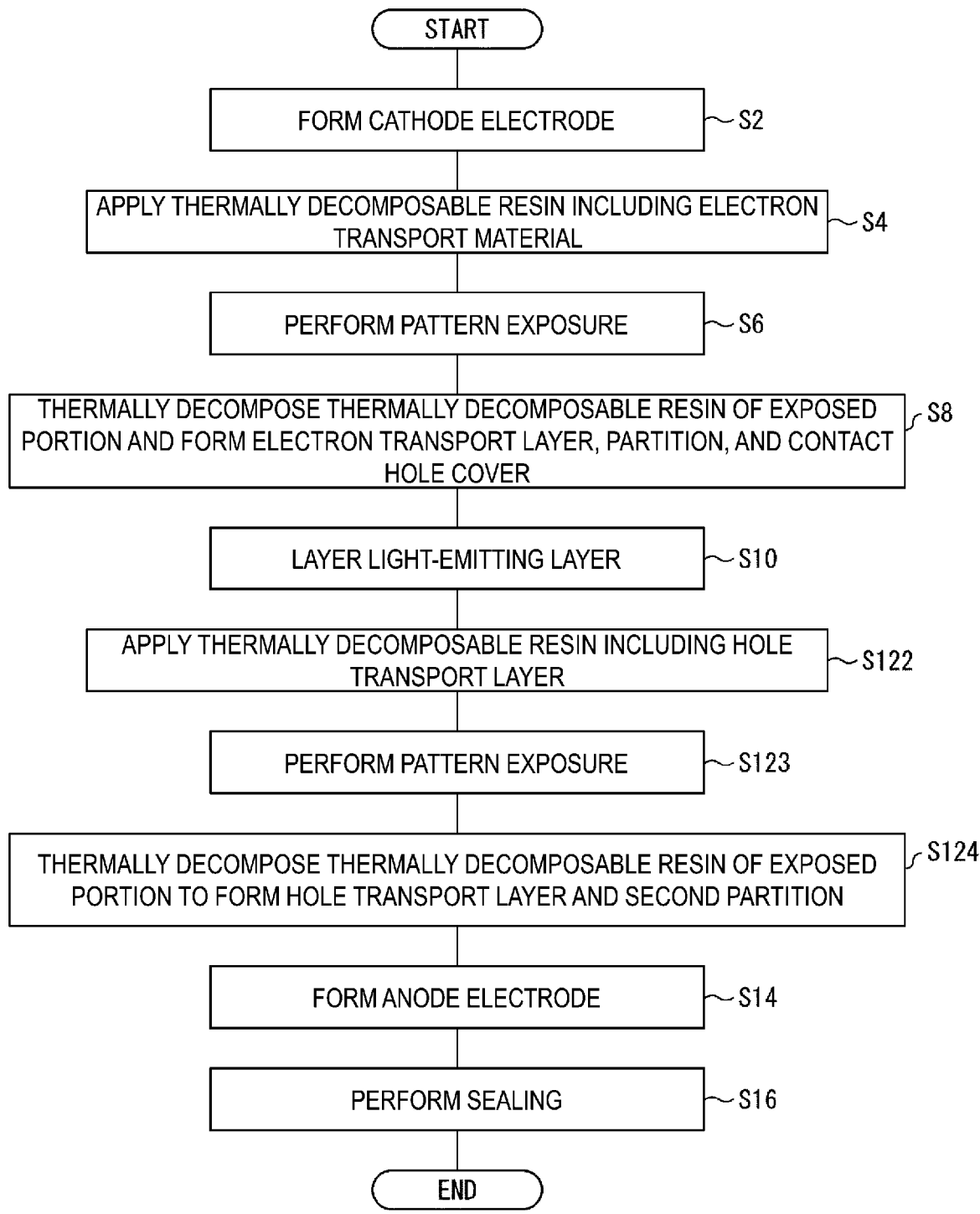
FIG. 45 is an enlarged schematic view illustrating the partition and the second partition in a method for manufacturing a display device according to a modified example of the ninth embodiment of the disclosure.
Figure 46:
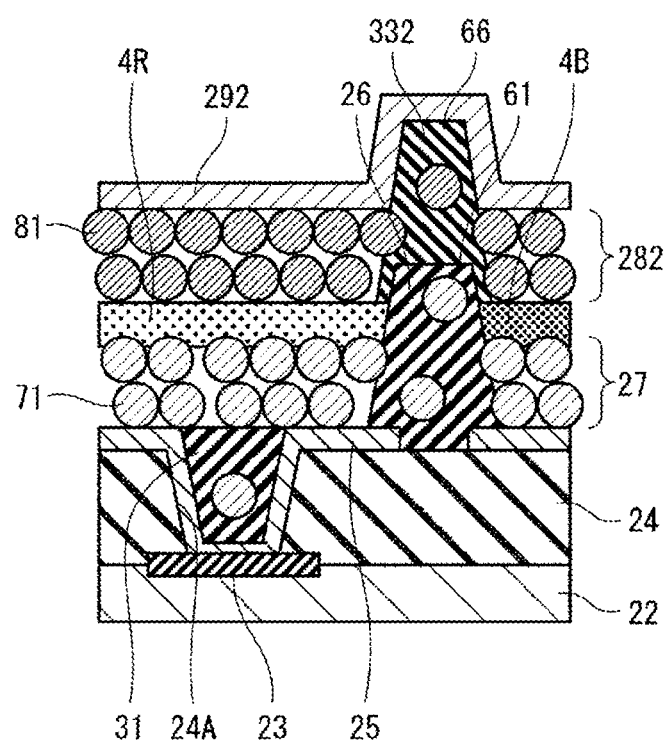
FIG. 46 is a flowchart illustrating the method for manufacturing the display device according to the ninth embodiment of the disclosure.

A ninth embodiment differs from the first embodiment in that, as illustrated in FIG. 44 and FIG. 46, in step S124, a hole transport layer 282 and a second partition 33 are collectively formed. Hereinafter, the ninth embodiment will be described in detail with reference to FIG. 44 to FIG. 46.

First, a second thermally decomposable resin 66 including a hole transport material (second charge transport material) 81 is applied to the light-emitting layer 4R, 4G, 4B formed similarly to step S10 (in FIG. 10) of the first embodiment and the partition 26 (step S122 in FIG. 45: second coating). For the hole transport material 81, a known material can be used as in the first embodiment. Furthermore, the particle diameter, the coating method, and the volume ratio in a film of the hole transport material 81 may be similar to the particle diameter, the coating method, and the volume ratio in the film of the electron transport material 71 according to the first embodiment. Also, for the second thermally decomposable resin 66, a material similar to the thermally decomposable resin 61 according to the first embodiment can be used. A coating thickness of the second thermally decomposable resin 66 including the hole transport material 81 is preferably the same degree as the coating thickness of the thermally decomposable resin 61 including the electron transport material 71 according to the first embodiment. This is because when the coating thickness of the second thermally decomposable resin 66 including the hole transport material S1 is thicker than necessary, the possibility of increasing the time required for thermal decomposition in step S124 in FIG. 45 and reducing production efficiency is prevented.

Next, the second thermally decomposable resin 66 is irradiated with light through a photomask (not illustrated), and the second thermally decomposable resin 66 is subjected to pattern exposure (step S123 in FIG. 45). This photomask is disposed to cover the partition 26. The irradiation light used in step S123 may be similar to the irradiation light used in step S6 in FIG. 10.

Next, the second thermally decomposable resin 66 is heated and the second thermally decomposable resin 66 of the exposed portion is thermally decomposed to form the hole transport layer 282 and the second partition 33 (step S124 in FIG. 45: second decomposition processing). The second partition 33 is provided by using the second thermally decomposable resin 66 and defines the subpixel SP. The heating method, the heating temperature, and the heating time used in step S124 may be similar to the heating method, the heating temperature, and the heating time used in step S8 in FIG. 10.

As with the partition 26 illustrated in FIG. 6, the upper end of the second partition 33 is rounded (not illustrated), and the hole transport material 81 is left at least in the interior of the second partition 33 or on the surface of the second partition 33. Thus, since the hole transport material 81 remaining in the interior and/or on the surface of the second partition 33 refracts light, it is possible to control light emission by the display device 21 in response to how much of the hole transport material 81 is left, in the interior and/or on the surface of the second partition 33.

In addition, due to the diffraction of light during the exposure of step S123, a density of the hole transport material 81 increases as closer to the surface of the second partition 33. Thus, light to be reflected increases when light from the light-emitting layer 4R, 4G, 4B, which will be described later, reaches the surface of the second partition 33, and thus, light extraction efficiency is improved.

Next, as illustrated in FIG. 44, an anode electrode 292 is layered on the hole transport layer 282 and the second partition 33 (step S14 in FIG. 45). A method of forming the anode electrode 292 may be similar to that of the first embodiment. A shape of the anode electrode 292 has unevenness so as to follow the surface shape of the hole transport layer 282 and the second partition 33 that are located on the lower layer. The subsequent step S16 is similar to that of the first embodiment.

In the ninth embodiment, by the layered structure of the partition 26 and the second partition 33, the subpixel SP is divided with a high wall. In addition, the partition 26 and the second partition 33 respectively include the electron transport material 71 and the hole transport material 81. Thus, crosstalk between adjacent subpixels SP, for example, crosstalk of light or electricity, can be prevented.

Modified Example

In the embodiments described above, for example, as described in the first embodiment, the partition 26, the electron transport layer 27, and the contact hole cover 31 are formed as an identical layer as an upper layer of the cathode electrode 25, and as upper layers thereabove, the light-emitting layer 4R, 4G, 4B, the hole transport layer 28, the anode electrode 29, and the counter substrate 30 are formed in this order. However, in another aspect of the disclosure, the anode electrode 29 may be used instead of the cathode electrode 25 as the lower electrode. In this case, the partition 26, the hole transport layer 28, and the contact hole cover 31 are formed as an identical layer as an upper layer above the anode electrode 29, and as upper layers thereabove, the light-emitting layer 4R, 4G, 4B, the electron transport layer 27, the cathode electrode 25, and the counter substrate 30 may be formed in this order.

Additionally, in the embodiment described above, for example, in step S6 and step S8 of the first embodiment, after the thermally decomposable resin 61 is subjected to pattern exposure, the thermally decomposable resin 61 of the exposed portion is thermally decomposed. However, a method of partially decomposing the thermally decomposable resin 61 may be employed in place of step S6 and step S8. For example, the electron transport layer 27, the partition 26, and the contact hole 31 may be formed by irradiating only a portion of the thermally decomposable resin 61 to be decomposed with a high output laser.

Supplement

A manufacturing method for a display device according to a first aspect of the disclosure includes a method for manufacturing a display device in which a plurality of pixels and a plurality of first electrodes corresponding one-to-one to the plurality of pixels are provided in island shapes, and the method includes electrode forming of forming the plurality of first electrodes on a substrate, coating of applying thermally decomposable resin including a charge transport material to cover the plurality of first electrodes, and decomposition processing of decomposing the thermally decomposable resin and forming a charge transport layer, and forming a partition that defines the plurality of pixels and that is provided by using the thermally decomposable resin.

According to the configuration described above, the charge transport layer and the partition can be collectively formed, and thus, the manufacturing man-hours can be reduced.

In the method for manufacturing the display device according to a second aspect of the disclosure, in the first aspect, in the electrode forming, the plurality of first electrodes and a transistor may be connected through a contact hole formed with respect to an insulating film, and in the decomposition processing, a contact hole cover that covers the contact hole and that is provided by using the thermally decomposable resin may be formed.

According to the configuration described above, a thickness of the thermally decomposable resin applied to a portion where the contact hole is formed is larger than a thickness of the thermally decomposable resin applied to a portion where the contact hole is not formed. Thus, when the thermally decomposable resin applied to the electrode is collectively decomposed, it is possible to form the charge transport layer while forming the contact hole cover by leaving a part of the thermally decomposable resin applied to the portion where the contact hole is formed. As a result, the contact hole cover can also be formed collectively with the charge transport layer and the partition, and thus, further reduction in manufacturing man-hours can be achieved.

In the method for manufacturing the display device according to a third aspect of the disclosure, in the second aspect, in the decomposition processing, the contact hole cover may be formed by preventing decomposition of the thermally decomposable resin applied to a portion where the contact hole is formed.

According to the configuration described above, the contact hole cover can also be formed collectively with the charge transport layer and the partition, and thus, further reduction in manufacturing man-hours can be achieved.

The method for manufacturing the display device according to a fourth aspect of the disclosure may include, in the third aspect, layering a light-emitting layer over the charge transport layer and the partition.

According to the configuration described above, it is possible to reduce the manufacturing man-hours when the light-emitting layer is formed over the charge transport layer and the partition.

In the method for manufacturing the display device according to a fifth aspect of the disclosure, in the third or fourth aspect, in the decomposition processing, the partition and the contact hole cover may be integrally formed.

According to the configuration described above, it is not necessary to divide the partition and the contact hole cover, and thus, the decomposition conditions of the thermally decomposable resin for forming the partition and the contact hole cover are relaxed. Thus, the partition and the contact hole cover can be more easily formed.

The method for manufacturing the display device according to a sixth aspect of the disclosure may include, in the first aspect, layering, on the charge transport layer, at least one layer of a highly efficient charge transport layer formed of a highly efficient charge transport material that is a material being different from the charge transport material.

According to the configuration described above, the charge transport efficiency can be higher by forming the highly efficient charge transport layer in addition to the charge transport layer.

In the method for manufacturing the display device according to a seventh aspect of the disclosure, in the first aspect, the thermally decomposable resin includes a charge transport material for space filling that is a material being different from the charge transport material, and the particle diameter of the charge transport material for space filling may be different from a particle diameter of the charge transport material.

According to the configuration described above, a space filling rate of each charge transport material in the charge transport layer can be increased, and thus, the charge transport layer having high charge transport efficiency can be achieved.

The method for manufacturing the display device according to an eighth aspect of the disclosure may include, in the first aspect, supplemental coating of applying supplemental thermally decomposable resin including a supplemental charge transport material to the charge transport layer and the partition, supplemental decomposition processing of decomposing the supplemental thermally decomposable resin applied to the charge transport layer and forming a supplemental charge transport layer, and forming a supplemental partition that defines the plurality of pixels and that is provided by using the supplemental thermally decomposable resin.

According to the configuration described above, in order to implement the layered structure of the charge transport layer and the supplemental charge transport layer, in addition to collectively forming the charge transport layer and the partition, the supplemental charge transport layer and the supplemental partition can be collectively formed, and thus, the manufacturing man-hours can be reduced.

The method for manufacturing the display device according to a ninth aspect of the disclosure may include, in the first aspect described above, supplemental coating of applying supplemental thermally decomposable resin including a supplemental charge transport material to the thermally decomposable resin applied in the coating, and in the decomposition processing, the supplemental thermally decomposable resin applied to the thermally decomposable resin above the plurality of first electrodes may be decomposed and then, a supplemental charge transport layer may be formed, and a supplemental partition that defines the plurality of pixels and that is provided by using the supplemental thermally decomposable resin may be formed.

According to the configuration described above, in order to implement the layered structure of the charge transport layer and the supplemental charge transport layer, in addition to collectively forming the charge transport layer and the partition, the supplemental charge transport layer and the supplemental partition can be collectively formed, and thus, the manufacturing man-hours can be reduced. In addition, decomposing the thermally decomposable resin and preventing the thermally decomposable resin from being decomposed, and decomposing the supplemental thermally decomposable resin and preventing the supplemental thermally decomposable resin from being decomposed can be performed at the same time, and thus, the manufacturing man-hours can be reduced.

In the method for manufacturing the display device according to a tenth aspect of the disclosure, in the ninth aspect, the thermally decomposable resin includes a plurality of the charge transport materials, the supplemental thermally decomposable resin includes a plurality of the supplemental charge transport materials, and in the decomposition processing, a position of a lower end of a supplemental charge transport material disposed at a lowest position among the plurality of the supplemental charge transport materials may be made lower than a position of an upper end of a charge transport material disposed at a highest position among the plurality of the charge transport materials.

According to the configuration described above, the charge transport material and the supplemental charge transport material can be easily brought into proximity to each other, and thus, the charge transport efficiency can be easily improved.

The method for manufacturing the display device according to an eleventh aspect of the disclosure may include, in the first aspect described above, light-emitting-layer layering of layering a light-emitting layer on the charge transport layer, second coating of applying second thermally decomposable resin including a second charge transport material to the light-emitting layer and the partition, and second decomposition processing of decomposing the second thermally decomposable resin applied to the light-emitting layer and forming a second charge transport layer, and forming a second partition that defines the plurality of pixels and that is provided by using the second thermally decomposable resin.

According to the configuration described above, in order to implement the layered structure of the charge transport layer, the light-emitting layer, and the supplemental charge transport layer, in addition to collectively forming the charge transport layer and the partition, the supplemental charge transport layer and the supplemental partition can be collectively formed, and thus, the manufacturing man-hours can be reduced.

The method for manufacturing the display device according to a twelfth aspect of the disclosure may include, in the first aspect described above, insulating-resin coating of applying thermally decomposable insulating resin to cover the plurality of first electrodes between the electrode forming and the coating, and the decomposition processing may include decomposing the thermally decomposable insulating resin and the thermally decomposable resin and forming the charge transport layer, and forming an insulating partition that is provided by using the thermally decomposable insulating resin and that is located on a lower layer of the partition.

According to the configuration described above, the insulating partition, the charge transport layer, and the partition can be collectively formed, and thus, the manufacturing man-hours can be reduced. In addition, due to the layered structure of the insulating partition and the partition, the plurality of pixels are separated with a high wall, and thus, crosstalk between adjacent pixels can be prevented.

In the method for manufacturing the display device according to a thirteenth aspect of the disclosure, in any of the first to twelfth aspects, in the decomposition processing, the charge transport material may be left at least in an interior of the partition or on a surface of the partition.

According to the configuration described above, since the charge transport material remaining in the interior and/or on the surface of the partition refracts light, it is possible to control light emission by the display device in response to how much of the charge transport material is left in the interior and/or on the surface of the partition.

In the method for manufacturing the display device according to a fourteenth aspect of the disclosure, in any of the first to thirteenth aspects, the decomposition processing may include monomerizing only a portion of the thermally decomposable resin to be decomposed.

According to the configuration described above, it is easy to clearly divide the thermally decomposable resin into the portion to be thermally decomposed and a portion not to be decomposed.

In the method for manufacturing the display device according to a fifteenth aspect of the disclosure, in the fourteenth aspect, the monomerizing may be induced by irradiation with UV light.

A display device according to a sixteenth aspect of the disclosure includes a charge transport layer including a charge transport material, and a partition defining the charge transport layer, and the charge transport material is included at least in an interior of the partition or on a surface of the partition at a density lower than a density of an interior of the charge transport layer.

According to the configuration described above, since the charge transport material remaining in the interior and/or on the surface of the partition refracts light, it is possible to control light emission by the display device in response to how much of the charge transport material is left in the interior and/or on the surface of the partition. Furthermore, since the charge transport layer and the partition can be collectively formed, the manufacturing man-hours can be reduced, and the costs can be reduced.

The display device according to a seventeenth aspect of the disclosure may further include, in the sixteenth aspect described above, an insulating partition located on a lower layer of the partition.

In the display device according to an eighteenth aspect of the disclosure, in the fifteenth or sixteenth aspect, an upper end of the partition may be rounded.

According to the configuration described above, since a corner is removed from the upper end of the partition, it is difficult to generate step disconnection at the layer on the partition (for example, a counter electrode). As a result, since a yield is improved, further cost reduction can be achieved.

The display device according to a nineteenth aspect of the disclosure may further include, in any of the sixteenth to eighteenth aspects, a transistor, an insulating film, an electrode electrically connected to the transistor through a contact hole in a pixel formed in the insulating film, and a contact hole cover that fills the contact hole and that is provided in an identical layer to a layer of the partition by using an identical material to a material of the partition.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
   a charge transport layer including a charge transport material; and
   a partition defining the charge transport layer,
   wherein the partition includes the charge transport material, and
   a density of the charge transport material included in an interior of the charge transport layer is higher than a density of the charge transport material included at least in an interior of the partition or on a surface of the partition.

2. The display device according to claim 1, further comprising:
    an insulating partition located on a lower layer of the partition.
3. The display device according to claim 1, wherein an upper end of the partition is rounded.
4. The display device according to claim 1, further comprising:
    a transistor;
    an insulating film;
    an electrode electrically connected to the transistor through a contact hole in a pixel formed in the insulating film; and
    a contact hole cover that covers the contact hole and that is provided in a layer identical to a layer of the partition by using a material identical to a material of the partition.
5. The display device according to claim 1, wherein the density of the charge transport material included in the interior of the charge transport layer is higher than the density of the charge transport material included in the interior of the partition.
6. The display device according to claim 1, wherein the density of the charge transport material included in the interior of the charge transport layer is higher than the density of the charge transport material included in the interior of the partition and on the surface of the partition.

\* \* \* \* \*